US009356611B1

(12) United States Patent
Shyu et al.

(10) Patent No.: US 9,356,611 B1
(45) Date of Patent: May 31, 2016

(54) SYSTEMS AND METHODS INVOLVING PHASE DETECTION WITH ADAPTIVE LOCKING/DETECTION FEATURES

(71) Applicant: GSI Technology, Inc., Sunnyvale, CA (US)

(72) Inventors: Jyn-Bang Shyu, Cupertino, CA (US); Yoshinori Sato, San Jose, CA (US); Jae Hyeong Kim, San Ramon, CA (US); Lee-Lean Shu, Los Altos, CA (US)

(73) Assignee: GSI TECHNOLOGY, INC., Sunnyvale, CA (US)

( * ) Notice: Subject to any disclaimer, the term of this patent is extended or adjusted under 35 U.S.C. 154(b) by 0 days.

(21) Appl. No.: 14/607,068

(22) Filed: Jan. 27, 2015

Related U.S. Application Data

(63) Continuation-in-part of application No. 14/161,623, filed on Jan. 22, 2014, now Pat. No. 9,018,992, which is a continuation of application No. 12/982,839, filed on Dec. 30, 2010, now Pat. No. 8,638,144.

(60) Provisional application No. 61/291,319, filed on Dec. 30, 2009, provisional application No. 61/932,214, filed on Jan. 27, 2014.

(51) Int. Cl.
  *H03L 7/06* (2006.01)
  *H03L 7/085* (2006.01)
(52) U.S. Cl.
  CPC ........................ *H03L 7/085* (2013.01)
(58) Field of Classification Search
  None
  See application file for complete search history.

(56) References Cited

U.S. PATENT DOCUMENTS

| | | | |
|---|---|---|---|
| 5,519,887 A * | 5/1996 | Lieu ............................ | 455/266 |
| 5,646,519 A | 7/1997 | Hamilton et al. | |
| 5,811,998 A | 9/1998 | Lundberg et al. | |
| 6,087,868 A | 7/2000 | Millar | |
| 6,140,852 A | 10/2000 | Fischer et al. | |
| 6,242,955 B1 | 6/2001 | Shen et al. | |
| 6,313,707 B1 | 11/2001 | Fischer et al. | |
| 6,337,590 B1 | 1/2002 | Millar | |
| 6,590,426 B2 | 7/2003 | Perrott | |
| 6,618,283 B2 | 9/2003 | Lin | |
| 6,759,882 B2 | 7/2004 | Lin | |
| 6,791,381 B2 | 9/2004 | Stubbs et al. | |
| 6,809,555 B1 | 10/2004 | Nguyen | |
| 6,812,753 B2 | 11/2004 | Lin | |
| 6,826,247 B1 | 11/2004 | Elliot et al. | |
| 7,010,014 B1 | 3/2006 | Percey et al. | |
| 7,034,590 B2 | 4/2006 | Shin | |
| 7,085,544 B2 | 8/2006 | Takano et al. | |

(Continued)

OTHER PUBLICATIONS

Dehng, G. et al., "Clock-Dskew Buffer Using a SAR-Controlled Delay-Locked Loop", IEEE Journal of Solid-State Circuits, vol. 35, No. 8, Aug. 2000, pp. 1128-1136; 9 pages.

(Continued)

*Primary Examiner* — Cassandra Cox
(74) *Attorney, Agent, or Firm* — DLA Piper LLP (US)

(57) ABSTRACT

Systems and methods associated with control of clock signals are disclosed. In one exemplary implementation, there is provided a delay-lock-loop (DLL) and/or a delay/phase detection circuit. Moreover, such circuit may comprise digital phase detection circuitry, digital delay control circuitry, analog phase detection circuitry, and analog delay control circuitry. Implementations may include configurations that prevent transition back to the unlocked state due to jitter or noise.

26 Claims, 24 Drawing Sheets

(56) References Cited

U.S. PATENT DOCUMENTS

| | | | |
|---|---|---|---|
| 7,161,391 | B2 | 1/2007 | Lin |
| 7,187,742 | B1 | 3/2007 | Logue et al. |
| 7,190,200 | B2 | 3/2007 | Byun |
| 7,215,209 | B2 | 5/2007 | Park |
| 7,230,997 | B2 | 6/2007 | Kurakami et al. |
| 7,236,028 | B1 | 6/2007 | Choi |
| 7,324,787 | B2 | 1/2008 | Kurakami et al. |
| 7,336,752 | B2 | 2/2008 | Vlasenko et al. |
| 7,372,341 | B2 | 5/2008 | Nagarakanti et al. |
| 8,638,144 | B1 | 1/2014 | Shyu |
| 2006/0119396 | A1 | 6/2006 | Lim |
| 2006/0139076 | A1 | 6/2006 | Park |
| 2006/0267636 | A1 | 11/2006 | Lin |
| 2008/0130816 | A1 | 6/2008 | Martin et al. |
| 2008/0265957 | A1 | 10/2008 | Luong et al. |
| 2008/0284525 | A1 | 11/2008 | Williams |
| 2009/0041104 | A1 | 2/2009 | Bogdan |
| 2009/0257542 | A1 | 10/2009 | Evans et al. |

OTHER PUBLICATIONS

Lin, F. et al., "A Register-Controlled Symmetrical DLL for Double-Data-Rate DRAM", IEEE Journal of Solid-State Circuits, vol. 34, No. 4, Apr. 1999, pp. 565-568; 4 pages.

* cited by examiner

SYSTEMS AND METHODS INVOLVING PHASE DETECTION WITH ADAPTIVE LOCKING/DETECTION FEATURES

CROSS-REFERENCE TO RELATED APPLICATIONS

This is a continuation-in-part of application Ser. No. 14/161,623, filed Jan. 22, 2014, U.S. Pat. No. 9,018,992, which is a continuation of application Ser. No. 12/982,839, filed Dec. 30, 2010, U.S. Pat. No. 8,638,144, which claims benefit/priority of provisional application No. 61/291,319, filed Dec. 30, 2009. This application also claims benefit/priority of provisional patent application No. 61/932,214, filed Jan. 27, 2013, which is also incorporated herein by reference in entirety.

BACKGROUND

1. Field

The present innovations relate to relate to provision, control and/or other aspects of clock signal operation(s).

2. Description of Related Information

Numerous computer and chip applications entail provision of a secondary clock signal that is synchronized to a reference clock. Many systems and techniques associated with Delay-Locked Loop ("DLL") circuits, for example, include clock generators used to synchronize the output clocks with the input reference clock(s) for high-speed applications, such as with synchronous SRAM and DRAM. In general, high-speed digital systems often utilize clock generators with improved tuning or other features to improve performance.

As set forth below, one or more exemplary aspects of the present inventions may overcome such shortcomings and/or otherwise impart innovative aspects by, for example, providing circuitry with improved ability to maintain a locked state of a clock signal despite jitter or noise.

Additionally, with regard to additional aspects of the inventions herein, particularly with regard to higher speed operation, such aspects provide further innovation over existing circuitry/schemes of adaptive digital phase detector (DPD) that use a narrow lock-detect window to compare the rising-edges of the full-rate input reference clock (XCK) to these of the full-rate delay line feedback clock (FCK) before the DLL reaches its phase-locked state. Here, an advantage of comparing full-rate clocks before the DLL is locked is that the DLL lock-in time is minimized in that the rising edges of the full-rate clocks have the most edge transitions compared to these of the divided-down lower-rate clocks. Here, after the DLL reaches its phased-locked state, the lock-detect window of the adaptive DPD is automatically widened to avoid the unwanted out of phase lock condition caused by the random noise effects.

However, in certain situations, widening the lock-detect window may cause timing margin issues for high-speed full-rate clock operations. Therefore, previous innovations provided after the DLL reaches its phase-locked state is to divide down both the reference clock (XCK/N) and the feedback clock (FCK/N) to get more timing margin for widening the lock-detect window of the adaptive DPD. When the clock speed increases further, however, even usage of a narrow lock-detect wind before the DLL reaches its phase-locked state presents a timing margin challenge.

As set forth below, one or more exemplary aspects of the present inventions may overcome such shortcomings and/or otherwise impart innovative aspects by, for example, providing circuitry with improved ability to achieve lock and/or maintain a locked state of a clock signal despite jitter or noise.

OVERVIEW OF SOME ASPECTS

Systems, methods and circuits consistent with the innovations herein relate to provision, control and/or other aspects of clock signals.

In one exemplary implementation, there is provided delay-lock-loop (DLL) and/or a delay/phase detection circuitry. Moreover, such circuitry may comprise digital phase detection circuitry, digital delay control circuitry, analog phase detection circuitry, and analog delay control circuitry. Implementations may include configurations and/or innovations that prevent transition back to the unlocked state due to jitter or noise.

Further, additional innovations herein of adaptive phase detection may include features of dividing down both the reference clock (XCK/N) and the feedback clock (FCK/N) even before the DLL reaches its phase-locked state. These lower-rate clocks (XCK/N, FCK/N) will increase the DLL lock-in time in that the rising edge transitions of the lower-rate clocks become less compared to the full-rate clocks (XCK, FCK), which may solve the lock-in timing issue(s) noted above via using both the rising edges and the falling edges of the lower-rate clocks to compare the timing difference not only between the rising edges to rising edges and the falling edges to falling edges of these lower-rate clocks but also between the rising edges to falling edges and the falling to rising edges as well. As such, edge transitions of the both lower-rate clocks may have the same amount just like the full-rate clocks have, and the original lock-in time of the DLL may be preserved.

It is to be understood that both the foregoing general description and the following detailed description are exemplary and explanatory only and are not restrictive of the invention, as described. Further features and/or variations may be provided in addition to those set forth herein. For example, the present invention may be directed to various combinations and subcombinations of the disclosed features and/or combinations and subcombinations of several further features disclosed below in the detailed description.

DESCRIPTION OF THE DRAWINGS

The accompanying drawings, which constitute a part of this specification, illustrate various implementations and aspects of the present invention and, together with the description, explain the principles of the invention. In the drawings.

DETAILED DESCRIPTION OF EXEMPLARY IMPLEMENTATIONS

Reference will now be made in detail to the innovations herein, examples of which are illustrated in the accompanying drawings. The implementations set forth in the following description do not represent all implementations consistent with the inventions developed. Instead, they are merely some examples consistent with certain aspects related to the present innovations. Wherever possible, the same reference numbers will be used throughout the drawings to refer to the same or like parts.

Many systems and techniques associated with Delay-Locked Loop ("DLL") circuits include clock generators used to synchronize the output clocks with the input reference clock(s) for high-speed applications, such as with synchronous SRAM and DRAM. In general, high-speed digital systems often utilize clock generators with improved tuning or other features to improve performance.

Figure 1:
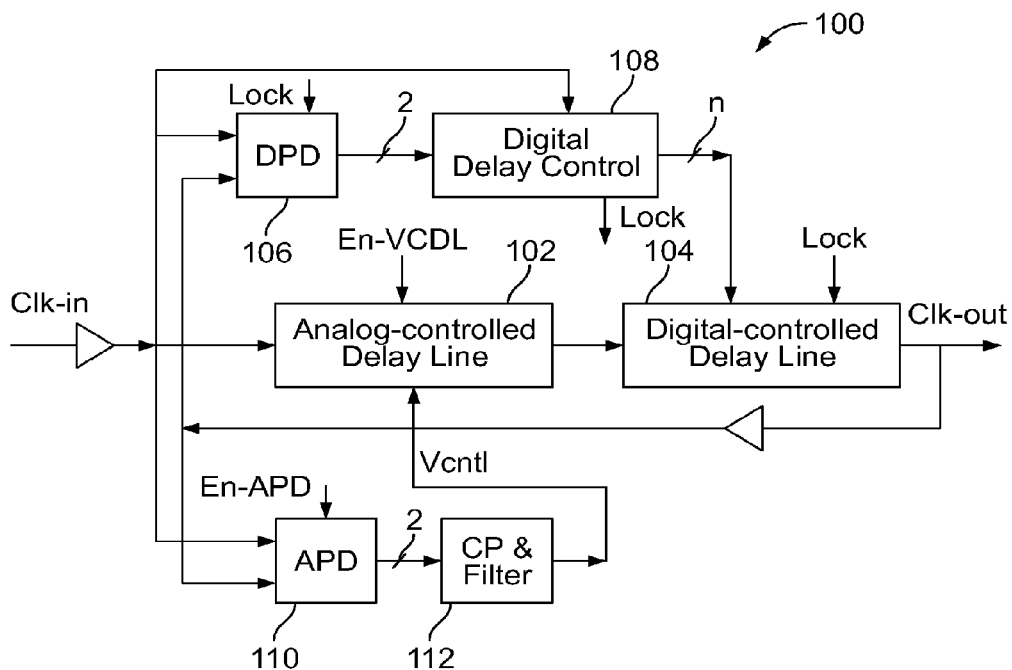
FIG. 1 illustrates a block diagram of an exemplary digital phase detector circuit consistent with certain aspects related to the innovations herein.

FIG. 1 illustrates a block diagram of an exemplary Delay-Locked Loop circuit 100 consistent with certain aspects related to the innovations herein. With regard to the representative Delay-Locked Loop circuitry shown, the circuit includes both a digital delay line 102 and an analog delay line 104 to enhance its delay tuning capability. Referring to FIG. 1, the illustrative circuit 100 may further comprise digital phase detector circuitry 106, digital delay control circuitry 108, analog phase detector circuitry 110 as well as other circuitry, such as charge-pump and/or filter circuitry 112 associated with the analog phase detector circuitry 110 or analog-controlled delay line 102. In one implementation, the digital phase detector 106 (DPD) and analog phase detector 110 (APD) are configured to control the digital delay line 104 and the analog delay line 102, respectively.

With regard to operation of such Delay-Locked Loop circuitry, the digital phase detector circuitry 106 may be configured to initially operate while the analog phase detector circuitry 110 stays at the standby mode. After the digital phase detector 106 achieves the phase-locking condition, i.e., the clock phases of both the input and output clocks are closely aligned in phase, then the analog phase detector circuitry 110 will commence operation to further align the phases of both input and output clocks by control signal En-APD. The circuitry 110 may then perform additional alignment of the output clock with the input clock, e.g., in jittery or noisy environments such as simultaneous switching outputs (SSO) in high-speed memory applications. Here, for example, improved jitter performance for the output clock can be achieved by using the mixed-mode DLL 100, which consists of both digital and analog delay loop functions. Conventionally, in order to minimize the phase difference between the input clock and output clock, a narrow, pre-defined timing window (e.g., fine phase detect window) for the digital phase detector has been used.

Figure 2:
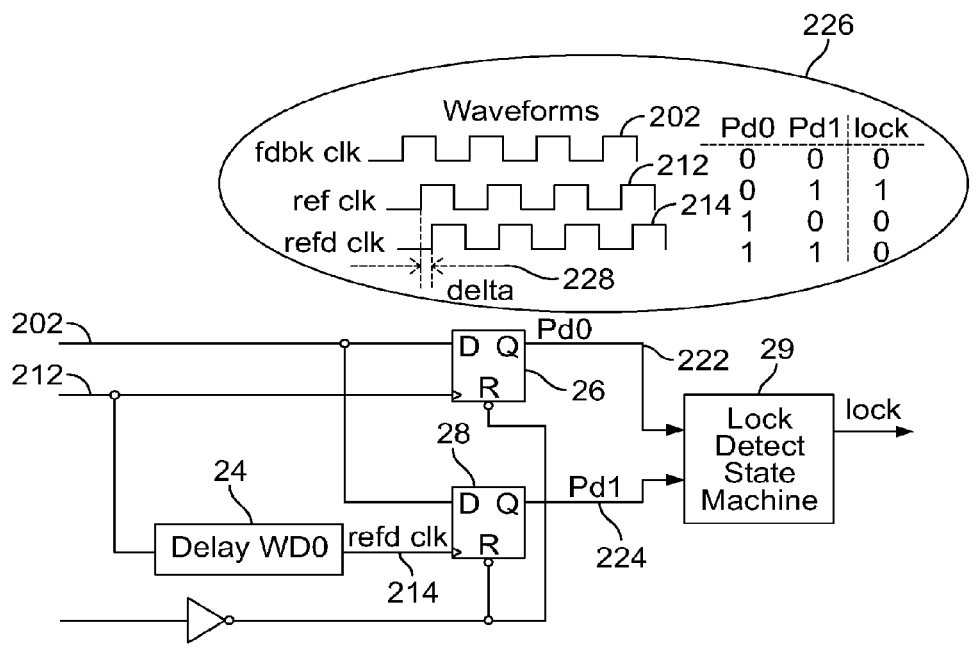
FIG. 2 illustrates a block diagram of a representative digital phase detector circuit known in the art, and related waveforms.

FIG. 2 illustrates a block diagram of an illustrative digital phase detector circuit and associated truth table representative of existing circuits [1, 2]. Referring to the circuit of FIG. 2, an illustrative digital phase detector may comprise a first input line, such as a feedback clock 202, and a second input line, such as a reference clock 212, that are fed into a pair of flip-flops 26, 28 to provide the logic signals for lock detect circuitry 29. Here, for example, the feedback clock 202 and the reference clock 212 may be provided as inputs to the first flip-flop 26 of the pair of flip-flops. Further, the feedback clock 202 and a delayed version of the reference signal (refd_clk) 214 may be provided as inputs to the second flip-flop 28. The delayed reference signal 214 may be provided by transmitting the reference signal through a delay circuit 24. Additionally, then, the first flip-flop 26 provides, as output, a first lock signal 222 for transmission to the lock detect circuitry, and the second flip-flop 28 provides, as output, a second lock signal 224 also for the lock detect circuitry. The interrelationship between the feedback and reference clock signals 202, 212, the two sampled feedback clock signals of Pd0 222 and Pd1 224, and the lock detect circuitry 29 output (i.e. lock) are shown via the summary and truth table 226 of FIG. 2, which indicates how the digital phase detector operates and how the phase-locking condition is achieved. The graph of waveforms in this summary 226 also illustrates an exemplary timing window 228 or delta within which the phase detection operation may occur.

Figure 3:
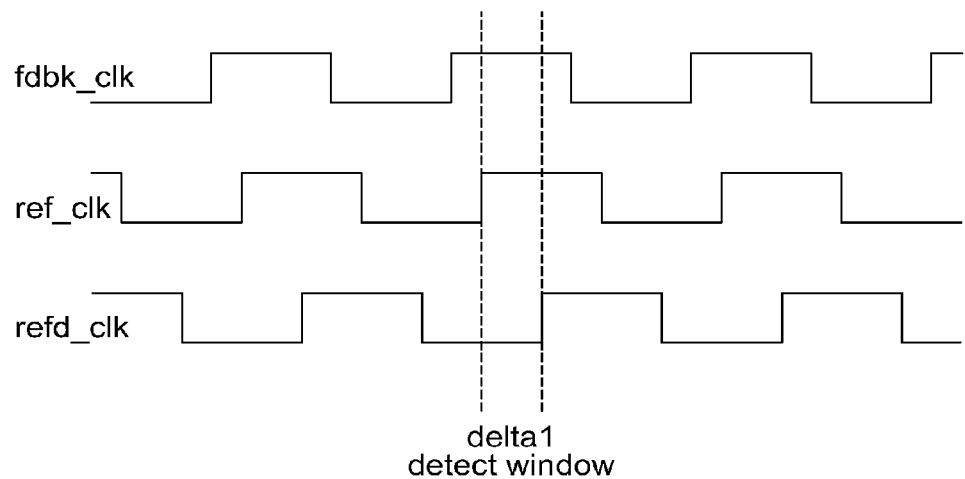
FIGS. 3 and 4 illustrate waveforms associated with representative digital phase detector circuit(s) known in the art.
Figure 4:
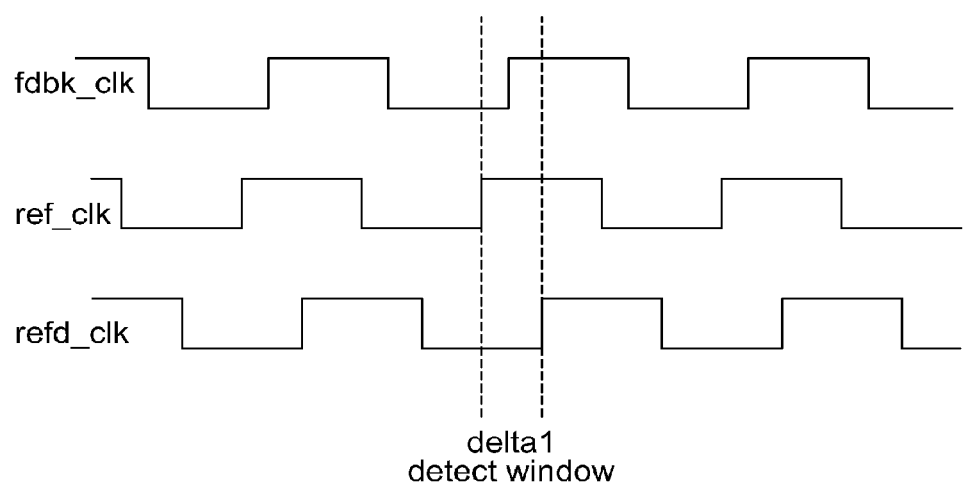

FIGS. 3 and 4 illustrate waveforms associated with representative digital phase detector circuit(s) known in the art. FIG. 3, for example, illustrates waveforms of a DLL in an unlocked condition, wherein the feedback clock is not locked to the reference clock and the rising edge of the feedback clock is characterized as preceding the rising edge of the reference clock. Here, the feedback clock is outside the detect window, thus no lock exists. FIG. 4, illustrates waveforms of a DLL in an locked condition, wherein the rising edge of the feedback clock now falls between the rising edge of the reference clock and the rising edge of the delayed reference clock.

After phase lock is achieved in Delay-Locked Loop ("DLL") systems including such circuitry, excessive cycle-to-cycle jitters of the output clock, e.g., caused by noisy environments, may force the DLL to be unlocked because the fairly small phase detection timing window on the order of a few hundred pico-seconds. Once, e.g., a mixed-mode DLL of this nature becomes unlocked, its output clock will have to re-start the locking process with the input reference clock. This re-locking process, in turn, often causes worse jitter performance for the output clock of the DLL.

Figure 5:
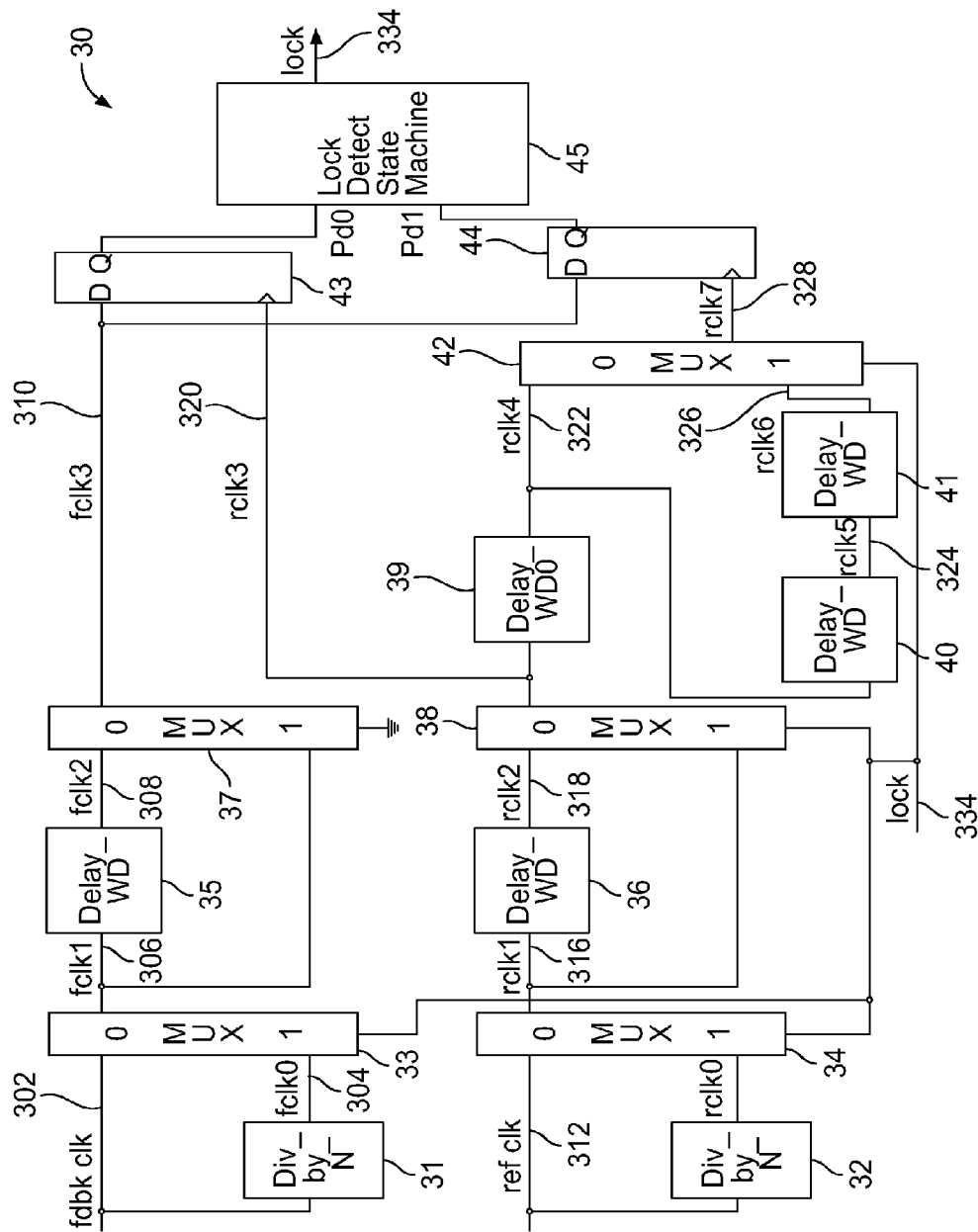
FIG. 5 illustrates a block diagram of an exemplary digital phase detector circuit consistent with certain aspects related to the present invention.

According to some implementations consistent with the innovations herein, for example, the digital phase detection window and/or the phase detection frequency may be adaptive. FIG. 5, for example, illustrates a block diagram of an exemplary digital phase detector circuit consistent with certain aspects related to the present invention. Adaptation is achieved by adjusting the phase detection window and enabling a clock divider for the input clock and the output clock of the digital phase detector circuit according to the phase locking conditions of the DLL. Referring to FIG. 5, exemplary circuit 30 may comprise two divide-by-N clock dividers 31, 32, several multiplexers 33, 34, 37, 38, 42, a variety of delay circuits 35, 36, 39, 40, 41, flip-flops 43, 44, lock detection circuitry 45, and optionally other circuits (not shown). The two main clock inputs of the exemplary digital phase detector 30, shown here, are a feedback clock 302 (fclk) and a reference clock 312 (xclk). In this exemplary implementation, the feedback clock 302 (fclk) is the feedback clock from the digital delay line of the delay-lock-loop circuitry. Referring to FIG. 5, both the feedback clock signal 302 and the reference clock signal 312 are input to respective divide-by-N clock dividers 31, 32. In one exemplary implementation, the dividers 31, 32 may be divide-by-2 dividers (e.g., N=2), as set forth and explained in more detail in connection with FIG. 6. The feedback clock signal 302 may be fed into a divide-by-N clock divider 31, with the output 304 (fclk0) of the divide-by-N clock divider 31 and its respective original clock signal 302 being provided as an input to a first multiplexer 33. (The reference clock signal 312 may be similarly fed into a divide-by-N clock divider 32 and second multiplexer 34, as set forth in more detail below.) The multiplexed feedback signal 306 (fclk1) is then provided as input both to a delay circuit 35 as well as to a third multiplexer 37, with the delayed version of the multiplexed feedback signal 308 (fclk2) being provided as the other input of the multiplexer 37. This third multiplexer output 310 (fclk3) is then provided as input to a first flip-flop 43, which also receives a similarly transformed signal 320 (rclk3) from a fourth multiplexer 38 as a second input. The first flip flop output signal is then provided as a first input of the lock detection circuitry, first lock signal 330 (pd0), with the second lock signal 332 (pd1) thereof being derived via reference clock processing circuitry.

With regard to the reference clock processing circuitry, the reference clock signal 312 may similarly be fed into a divide-by-N clock divider 32, with the output 314 (rclk0) of the divide-by-N clock divider 32 and its respective original reference clock signal 312 being provided as an input to the second multiplexer 34. The multiplexed reference signal 316 (rclk1) is then provided as input both to a delay circuit 36 as well as to a fourth multiplexer 38, with the delayed version of the multiplexed reference signal 318 (rclk2) being provided as the other input of the fourth multiplexer 38. This fourth multiplexer output 320 (rclk3) is then provided as a second input to the first flip-flop 43, as indicated above. Additionally, a delayed fourth multiplexer output signal 322 (rclk4) is provided via a third delay circuit 39 and provided as input to a fifth multiplexer 42. The delayed fourth multiplexer signal 322 is also fed through one or more stages of additional delay circuitry 40, 41 to provide a second signal 326 (rclk6) for input to the fifth multiplexer 42. The multiplexed output signal 328 (rclk7) of the fifth multiplexer 42 is then provided as an input to a second flip-flop 44 paired with the first flip-flop 43. The third multiplexer output 310 (fclk3) is provided as the other input to the second flip-flop 44, and the output of the second flip-flop 332 (pd1) is provided as the second input to the lock detect circuitry 45.

The difference between the consecutive rising edges of the fourth multiplexer output 320 (rclk3) and the multiplexed output signal 328 (rclk7) forms the phase detection or "delta-timing" window. As set forth in more detail below, when the DLL is unlocked, the delta-timing window will be set to be small. However, when the DLL reaches the lock state, the delta-timing window may be configured to transition to a wide/wider state for the benefit of better noise performance, as described elsewhere herein.

With regard to design and/or selection of the circuits, circuit elements and associated parameters, the phase detect window may be designed to be set small during initial circuit operation (i.e., before the digital phase detector detects a phase-locking condition) to enable achievement of a very tight phase alignment. Additionally, the phase detection frequency may be designed to be set high during initial circuit operation to achieve a very fast phase-locking time.

In one exemplary implementation, the circuitry has a configuration that achieves a very tight phase alignment and a very fast phase locking cycle time during initial operation. After the digital phase detector detects a phase-locking condition, the circuitry may include various adaptive configurations, such as being configured to automatically widen this phase detection window and may also be configured to reduce the phase detection speed to make sure that the DLL will not only remain in the locking condition under any noisy environments but also have a sufficient timing margin via lowering of the phase detection frequency.

Further, as described in the context including the overall Delay-Locked Loop, the clock dividers 31, 32 may be initially disabled to allow full speed operation of the phase detector for increasing the locking time of the DLL. After the DLL achieve a lock condition, the two clock dividers 31, 32 may be enabled. Further, the circuitry may be configured to such that a large phase detection window may then be selected. For example, here, a large/larger phase detection window may be selected via control of the lock signal(s) being applied to multiplexers, such as multiplexers 33, 34, 38 and 42. With a larger phase detection window, then, the analog locking range of the DLL may operate within a wider timing delay range to optimize the jitter performance. A larger phase detection window, however, may entail a very tight timing margin the digital phase detector's phase-sampling process under high-speed operations. Here, the timing margin of the phase-sampling process may be dramatically improved by dividing down the clock frequency of both input and feedback clocks of the digital phase detector.

In one exemplary implementation, the delay of the third delay circuit 39 may be designed such that its' delay is small relative to the delay of the other four delay circuits 35, 36, 40, 41. Moreover, additional examples having adaptive digital phase detection windows and/or adaptive phase detection frequency(ies) are set forth elsewhere herein. Consistent with these adaptiveness features, aspects of the innovations here may improve digital phase detector and/or DLL design to achieve better overall performance.

Figure 6A:
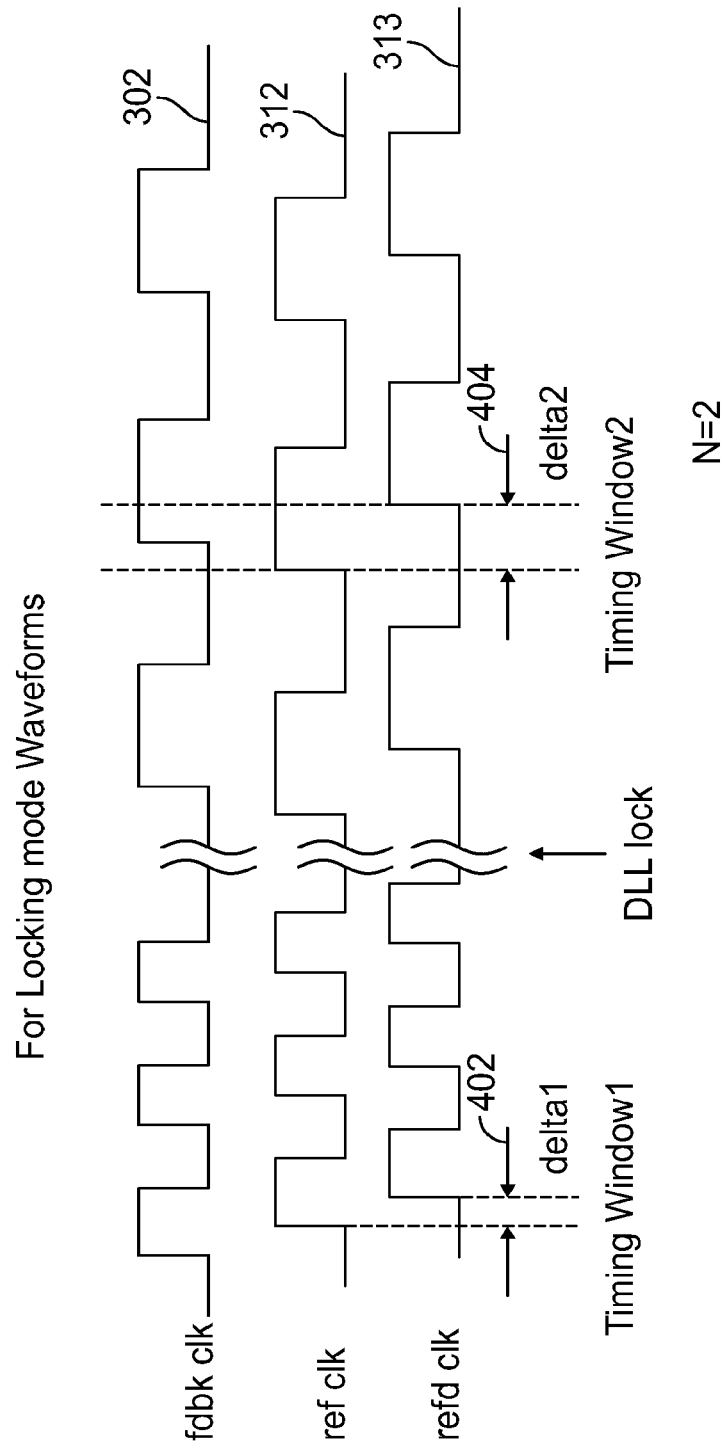
FIG. 6A depicts an illustrative waveform of exemplary digital phase detector circuitry consistent with certain aspects related to the innovations herein.

FIG. 6A depicts an several illustrative waveform of an exemplary digital phase detector circuit consistent with certain aspects related to the innovations herein. A feedback clock signal 302, a reference clock signal 312, and a delayed reference clock signal 313 are set forth in the drawing, showing states of the waveforms before and after a phase-locking mode are achieved. Referring to FIG. 6A, a smaller first timing window 402 ("delta1") is shown in connection with the digital phase detector prior to phase lock, and a wider second timing window 404 (delta2) is shown after phase lock. As seen in FIG. 6A, the timing window (difference in rising edges of the reference clock 312 and the reference delay clock 313) may be significantly wider after lock (see delta2 404) as compared to before lock (see delta1 402).

Figure 6B:
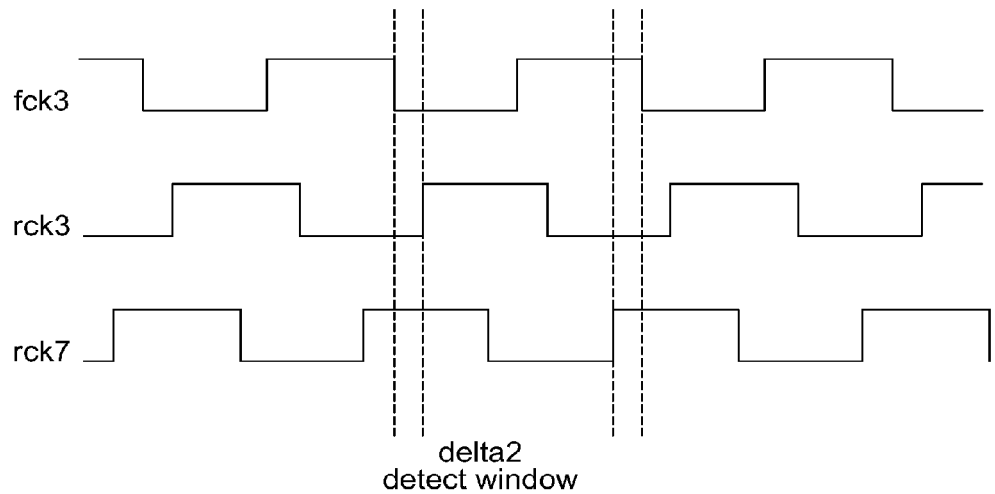
FIGS. 6B and 6C illustrate several illustrative waveforms of an exemplary digital phase detector circuit consistent with certain aspects related to the innovations herein.
Figure 6C:
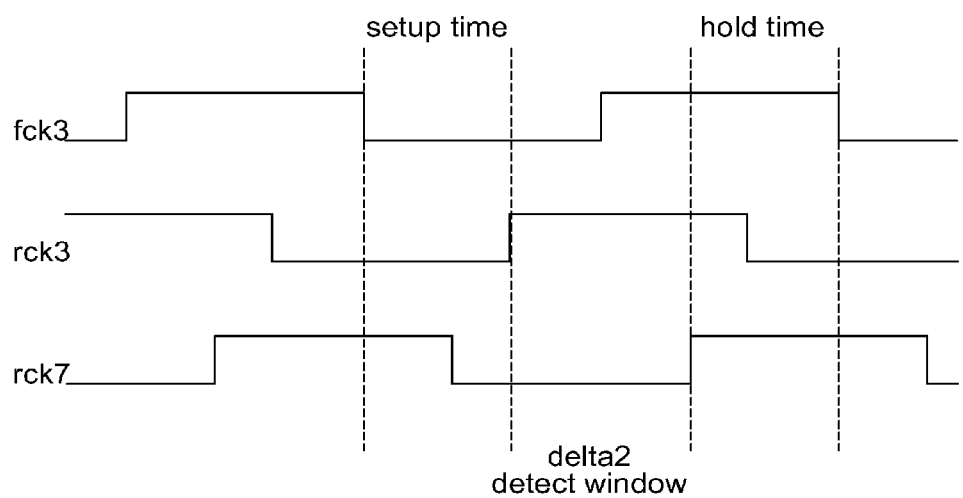

FIGS. 6B and 6C illustrate several illustrative waveforms of an exemplary digital phase detector circuit consistent with certain aspects related to the innovations herein. Referring to FIGS. 6B-6C, setup time/hold time features are shown setting forth how, for example, margin may be adaptively changed from a lock condition with no clock dividing circuits in FIG. 6B to a locked condition with a clock dividing circuit (e.g., divided by 2, in one exemplary implementation) in FIG. 6C, including how a divider may be utilized to assist in enabling the adaptive features, i.e., adjusting (e.g., improving, increasing, etc.) the timing aspects/specifications at high-speed operation. As such, here, once lock occurs (i.e., once the detect window is opened-up), the frequency of the clocks is reduced (e.g., divided-by-2, etc.) to provide a greater effective operating range for maintaining the lock. In other words, an un-lock condition is shown in FIG. 3 and the locked conditions are shown in both FIG. 6B and FIG. 6C. FIG. 6C is consistent with circuits implemented in accordance with features of the innovations herein. For example, according to aspects of the present innovations, the phase detect window may be widened after the DLL is locked. Further, as shown in FIG. 6C, a better setup/hold time margin may be achieved than that of FIG. 6B, via suitable frequency reduction circuitry. For example, a divide-by-N circuit or component, such as the divide-by-2 circuit of FIG. 6C, may be used to divide down the clock. Here, then, such frequency reduction may be achieved under the control of a lock signal to provide a wider timing margin.

Figure 7:
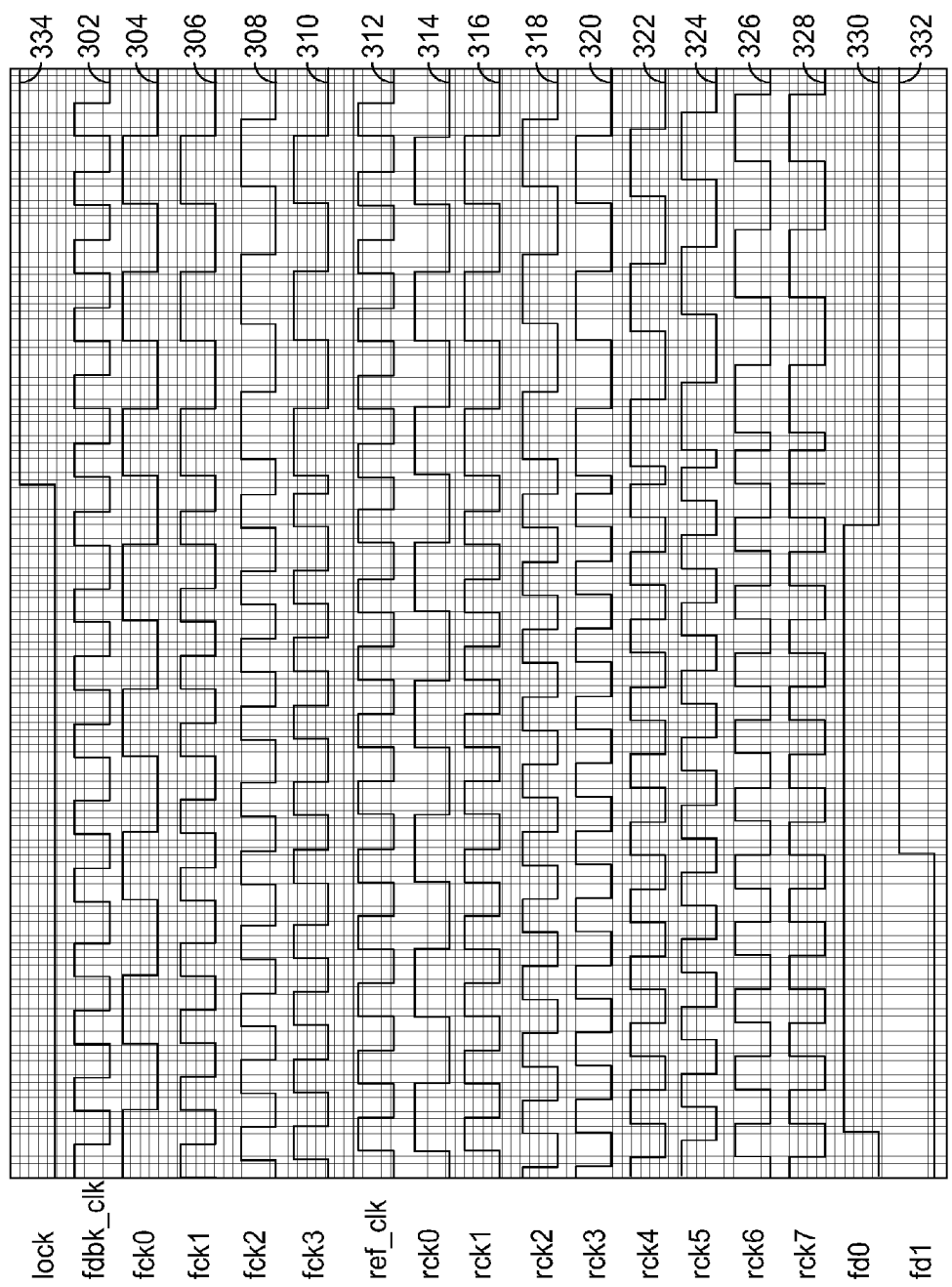
FIG. 7 illustrates a series of illustrative, interrelated waveforms of some exemplary digital phase detector circuits consistent with certain aspects related to the innovations herein.

FIG. 7 illustrates a series of illustrative, interrelated waveforms of some exemplary digital phase detector circuits consistent with certain aspects related to the innovations herein. There are 17 waveforms of an exemplary digital phase detector, as shown in FIG. 7. The first waveform is the lock signal 334 (i.e., lock), which controls the DPD operation. The second waveform (i.e. fdbk_clk) is the feedback clock 302 from the digital delay line of the DLL. The third waveform (i.e. fclk0) is the input divided-by-N signal 304, where N may be set equal to 2 in one exemplary implementation. The fourth waveform is the fclk1 signal 306, which is the multiplexed ("mux") output of fclk0 and fdbk_clk controlled by the lock signal. The fifth waveform 308 (i.e. fclk2) is the delay version of fck1. The sixth waveform 310 is the fclk3 signal. It is the mux output from the fck2 signal permanently-controlled by a pre-wired logic_zero. The seventh waveform 312 (i.e. ref_clk) is the input reference clock, to which the DLL will lock. The eighth waveform 314 (i.e. rclk0) is the input divided-by-N signal, where again N may be set equal to 2 as an example. The ninth waveform 316 (i.e. rclk1) is the mux output of rclk0 and ref_clk controlled by the lock signal. The tenth waveform 318 (i.e. rclk2) is the delay version of rck1. The eleventh waveform 320 (i.e. rclk3) is the mux output of rclk1 and rclk2 controlled by the lock signal. Here, for example, the rising edge of rclk3 may be used to sample the fclk3 signal with the first flip flop 43 to output the 16th waveform 330 (i.e. pd0). The 12th waveform 322 (i.e. rclk4) is a delay version of rclk3. The 13th waveform 324 (i.e. rclk5) is a delay version of rclk4, while the 14th waveform 326 (i.e. rclk6) is a delay version of rclk5. The $15^{th}$ waveform 328 (i.e. rclk7) is the mux output of rclk4 and rclk6. The rising edge of rclk7 will sample the fclk3 signal with the second flip-flop 44 to output the $17^{th}$ waveform 332 (i.e. pd1). As such, in this exemplary implementation, when pd0 is equal to logic_0 and pd1 is equal to logic_1, the DLL is configured to achieve the phase-locking condition and the lock signal will change from logic_0 to logic_1. Accordingly, again, the difference between the consecutive rising edges of rclk3 and rclk7 forms the delta-timing windows. When the DLL is unlocked, the delta-timing window will be set to be small. But, when the DLL reaches the lock state, the delta-timing window will become large for the benefits set forth elsewhere herein.

FIGS. 8A-8D illustrate a block diagram of an exemplary digital phase detector circuit consistent with certain aspects related to the present invention. Referring first to the figures, the exemplary circuit may comprise two divide-by-N clock dividers 602, 604, several multiplexers 610, 612, 620, 624, 658, a variety of delay circuits 616, 618, 626, 660, 662, flip-flops 630, 632, as well as lock detection circuitry (not shown) and other circuits. The two main clock inputs of the exemplary digital phase detector, shown here, are a feedback clock 302 (fclk) and a reference clock 312 (xclk). In this exemplary implementation, the feedback clock 302 (fclk) is the feedback clock from the digital delay line of the delay-lock-loop circuitry. Referring to FIG. 5, both the feedback clock signal 302 and the reference clock signal 312 are input to respective divide-by-N clock dividers 602, 604. In one exemplary implementation, the dividers 602, 604 may be divide-by-2 dividers (e.g., N=2), as set forth and explained in more detail in connection with FIG. 6. The feedback clock signal 302 may be fed into a divide-by-N clock divider 602, with the output 304 (fclk0) of the divide-by-N clock divider 602 and its respective original clock signal 302 being provided as an input to a first multiplexer 610. (The reference clock signal 312 may be similarly fed into a divide-by-N clock divider 604 and second multiplexer 612, as set forth in more detail below.) The multiplexed feedback signal 306 (fclk1) is then provided as input both to a delay circuit 616 as well as to a third multiplexer 620, with the delayed version of the multiplexed feedback signal 308 (fclk2) being provided as the other input of the multiplexer 620. This third multiplexer output 310 (fclk3) is then provided as input to a first flip-flop 630, which also receives a similarly transformed signal 320 (rclk3) from a fourth multiplexer 624 as a second input. The first flip flop output signal is then provided as a first input of the lock detection circuitry, first lock input 330 (pd0), with the second lock input 332 (pd1) thereof being derived via reference clock processing circuitry.

With regard to the reference clock processing circuitry, the reference clock signal 312 may similarly be fed into a divide-by-N clock divider 604, with the output 314 (rclk0) of the divide-by-N clock divider 604 and its respective original reference clock signal 312 being provided as an input to the second multiplexer 612. The multiplexed reference signal 316 (rclk1) is then provided as input both to a delay circuit 618 as well as to a fourth multiplexer 624, with the delayed version of the multiplexed reference signal 318 (rclk2) being provided as the other input of the fourth multiplexer 624. This fourth multiplexer output 320 (rclk3) is then provided as a second input to the first flip-flop 630, as indicated above.

Additionally, a delayed fourth multiplexer output signal 322 (rclk4) is provided via a third delay circuit 626 and provided as input to a fifth multiplexer 658. The delayed fourth multiplexer signal 322 is also fed through one or more stages of additional delay circuitry 660, 662 to provide a second signal 326 (rclk6) for input to the fifth multiplexer 658. The multiplexed output signal 328 (rclk7) of the fifth multiplexer 658 is then provided as an input to a second flip-flop 632 paired with the first flip-flop 630. The third multiplexer output 310 (fclk3) is provided as the other input to the second flip-flop 632, and the output of the second flip-flop 332 (pd1) is provided as the second input to the lock detect circuitry.

Digital phase detector circuitry as described herein may improve the overall performance of the DLL. However, full clock speed operation is required before the DLL is digitally phase locked, thereby limiting the digital phase detector operating speed when the clock frequency reaches to very high speed such as the clock frequency of 500 MHz and beyond.

Figure 8A:
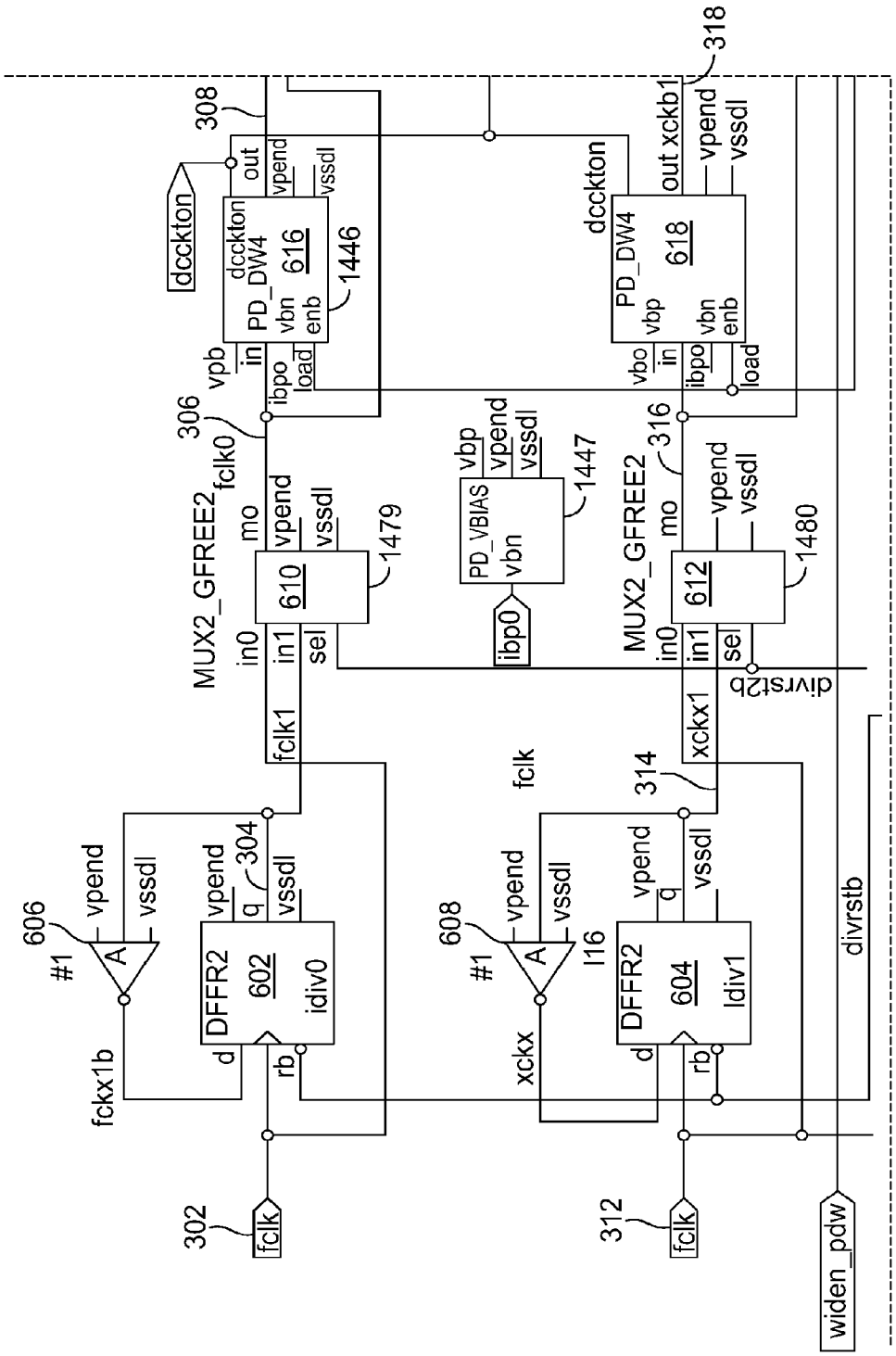
FIGS. 8A-8D illustrate a block diagram of an exemplary digital phase detector circuit consistent with certain aspects related to the innovations herein.
Figure 8B:
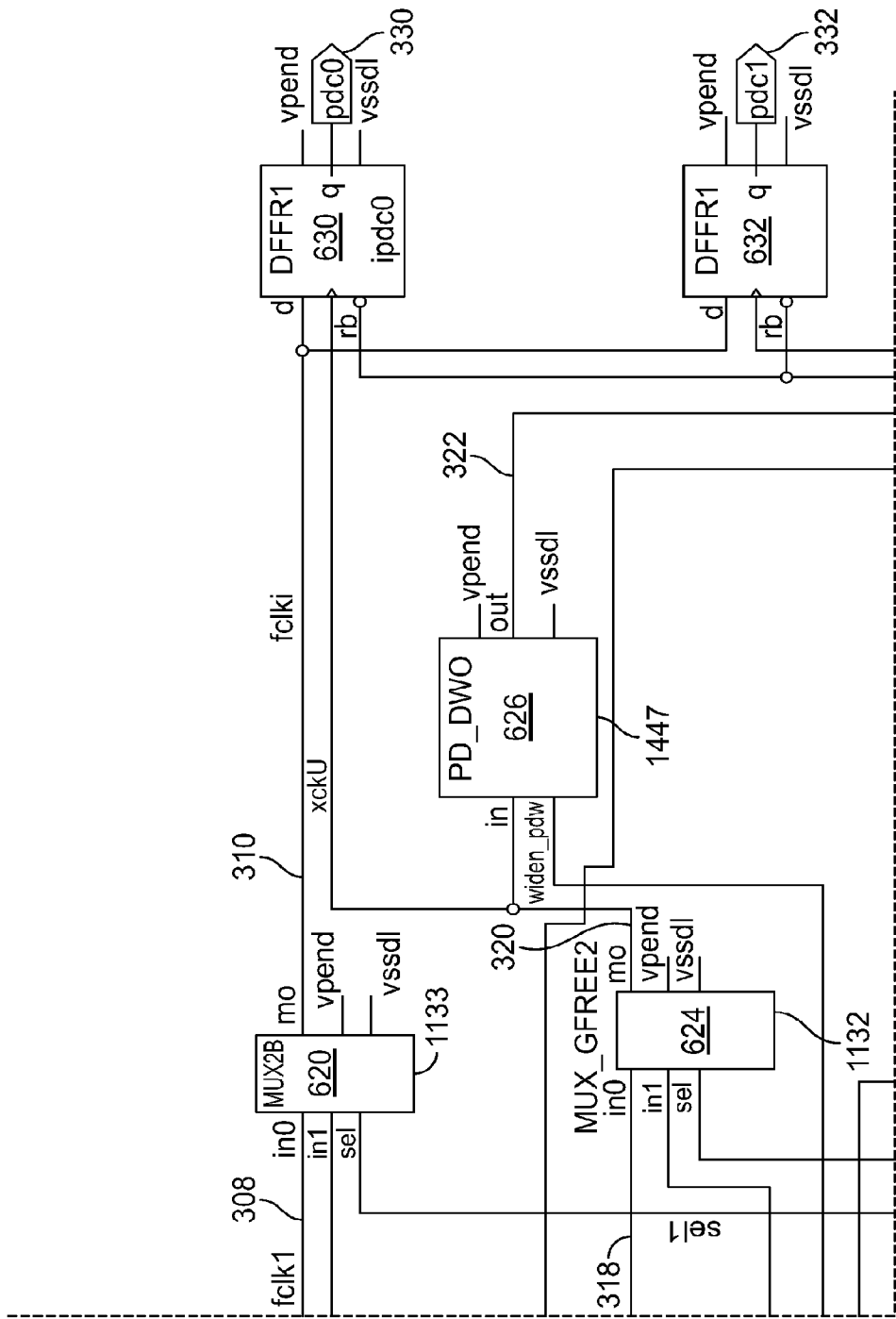
Figure 8C:
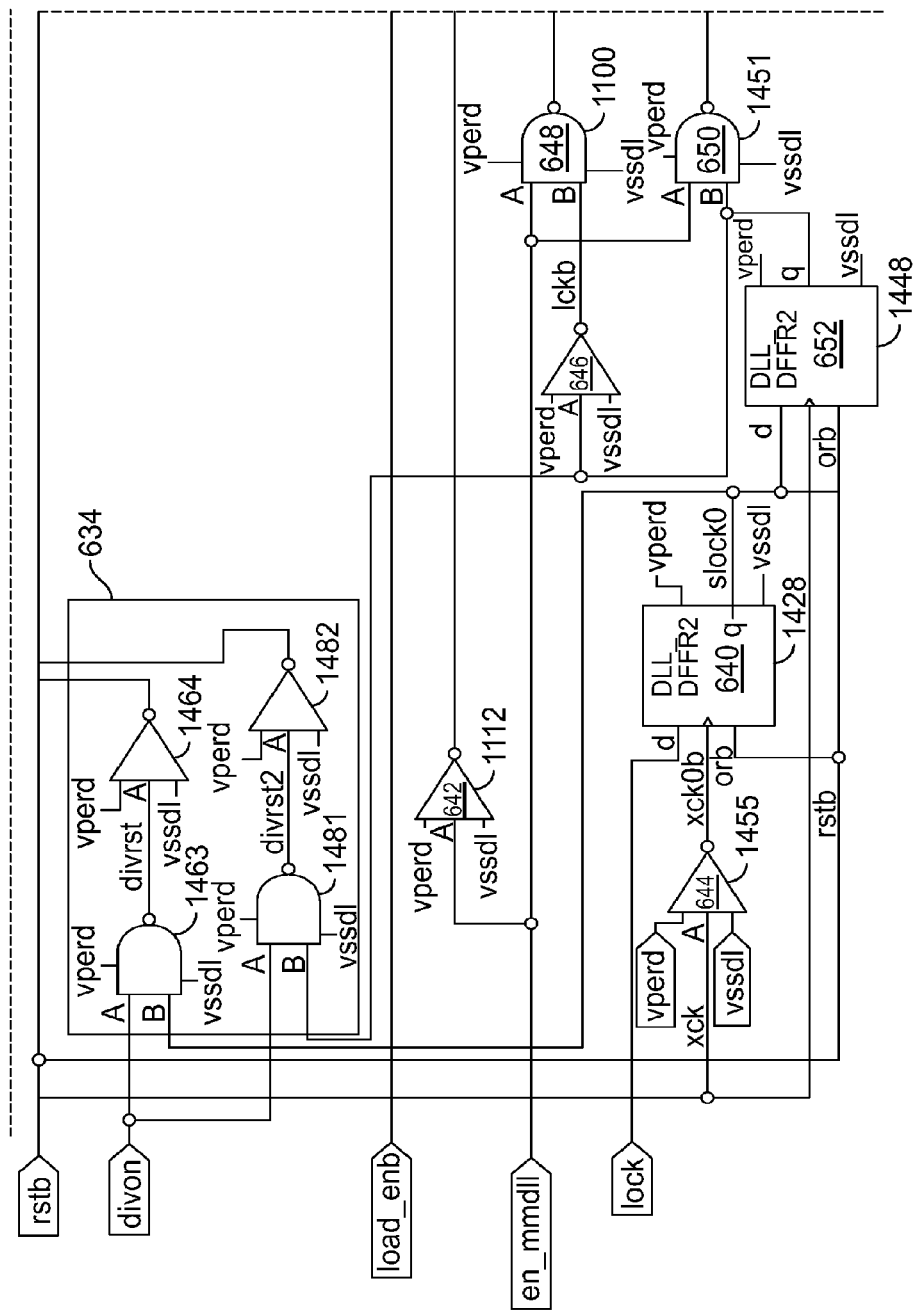
Figure 8D:
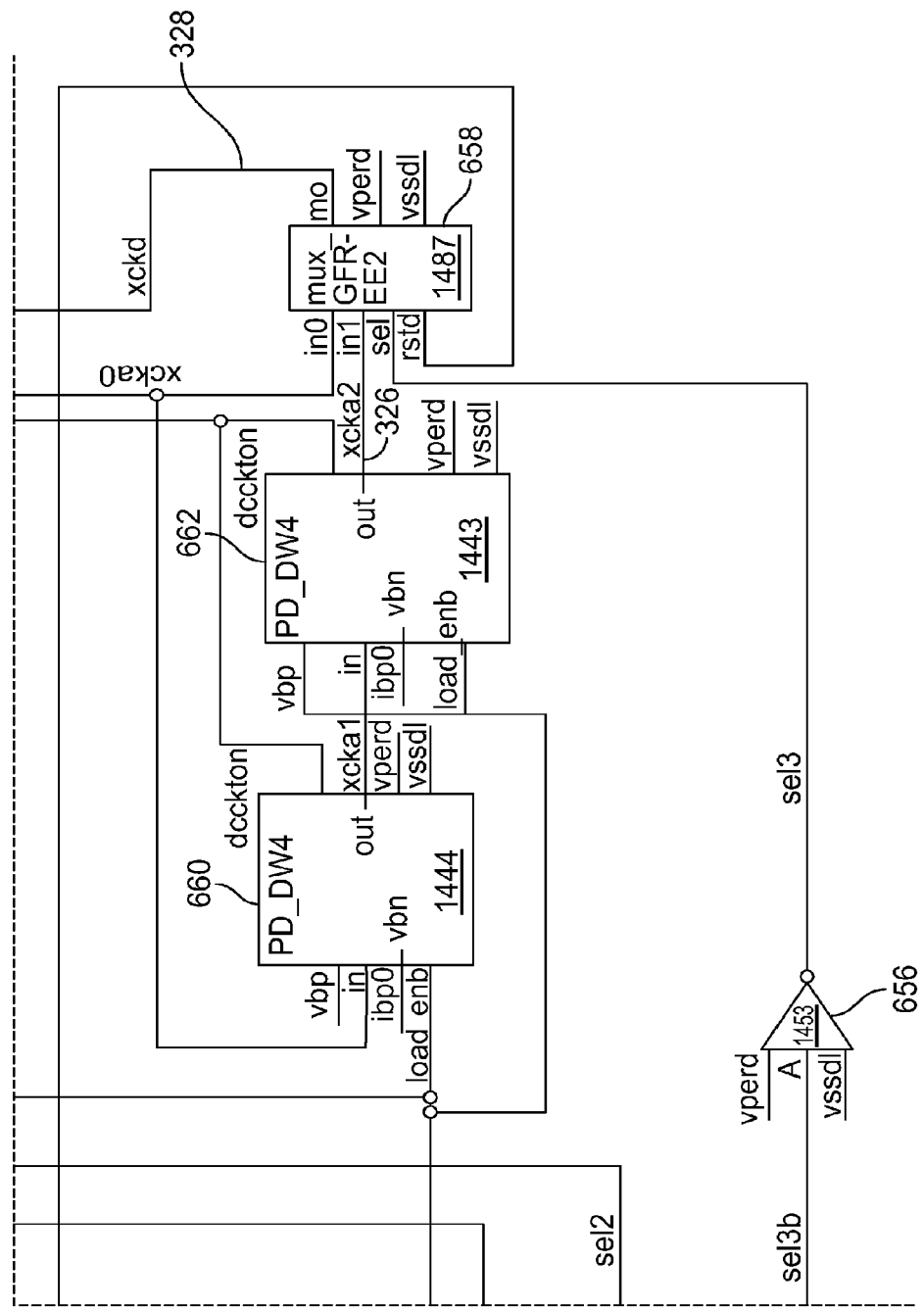
Figure 8E:
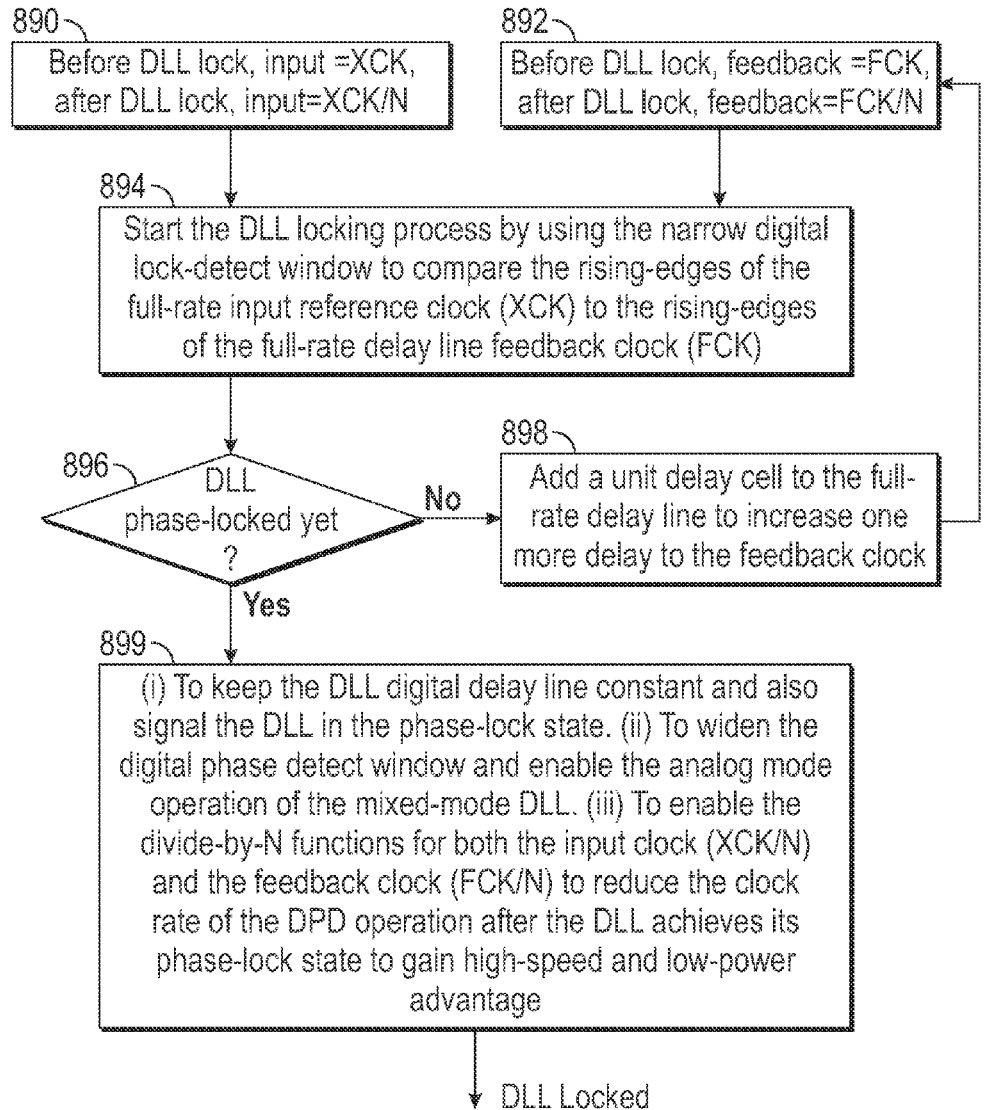
FIG. 8E is a flow diagram showing exemplary aspects of lock initiating and maintaining processing consistent with certain aspects related to the innovations herein.

FIG. 8E is a flow diagram showing exemplary aspects of lock initiating and maintaining processing consistent with certain aspects related to the innovations herein. FIG. 8E illustrates the flow chart of certain adaptive digital phase detector (DPD) functionality, as helpful comparison to FIG. 15. Input 890 shows that input reference clock XCK is operating at full-rate before the DLL reaches its phase-locked state and will operate at reduced 1/Nth-rate of XCK (e.g. XCK/N) when the DLL reaches its phase-locked state. At 894, the process indicates that the DPD uses a narrow lock-detect window to compare the rising edges of the full-rate input reference clock (XCK) to the rising edges of the full-rate delay line feedback clock (FCK). The box 96 checks whether the DLL reaches its phase-locked state or not. If not, at 898, the process may add a unit delay cell to the full-rate delay line to increase one more delay to the feedback clock and, at 892, may send the feedback clock (FCK) back to 894 to further compare the rising edges of XCK to the rising edges of FCK at full-rate. At 896, the process will continuously check the DLL phase-locked status until the DLL reaches its phase-locked state. Once the DLL reaches its phase-locked state, the process (at 899) may start to perform one or more of the following three operations: 1) To keep the DLL digital delay line constant and also signal the DLL has reached its phase-locked state; 2) To widen the digital lock-detect window at 894 and enable the analog mode operation of the mixed-mode DLL (not shown); 3) To enable the divide-by-N functions at 890 and 892 for both the input clock (e.g. XCK/N) and feedback clock (e.g. FCK/N) to reduce the clock rate of the DPD operation to gain the advantages of high-speed timing margin and low-power consumptions for this adaptive DPD.

Figure 9A:
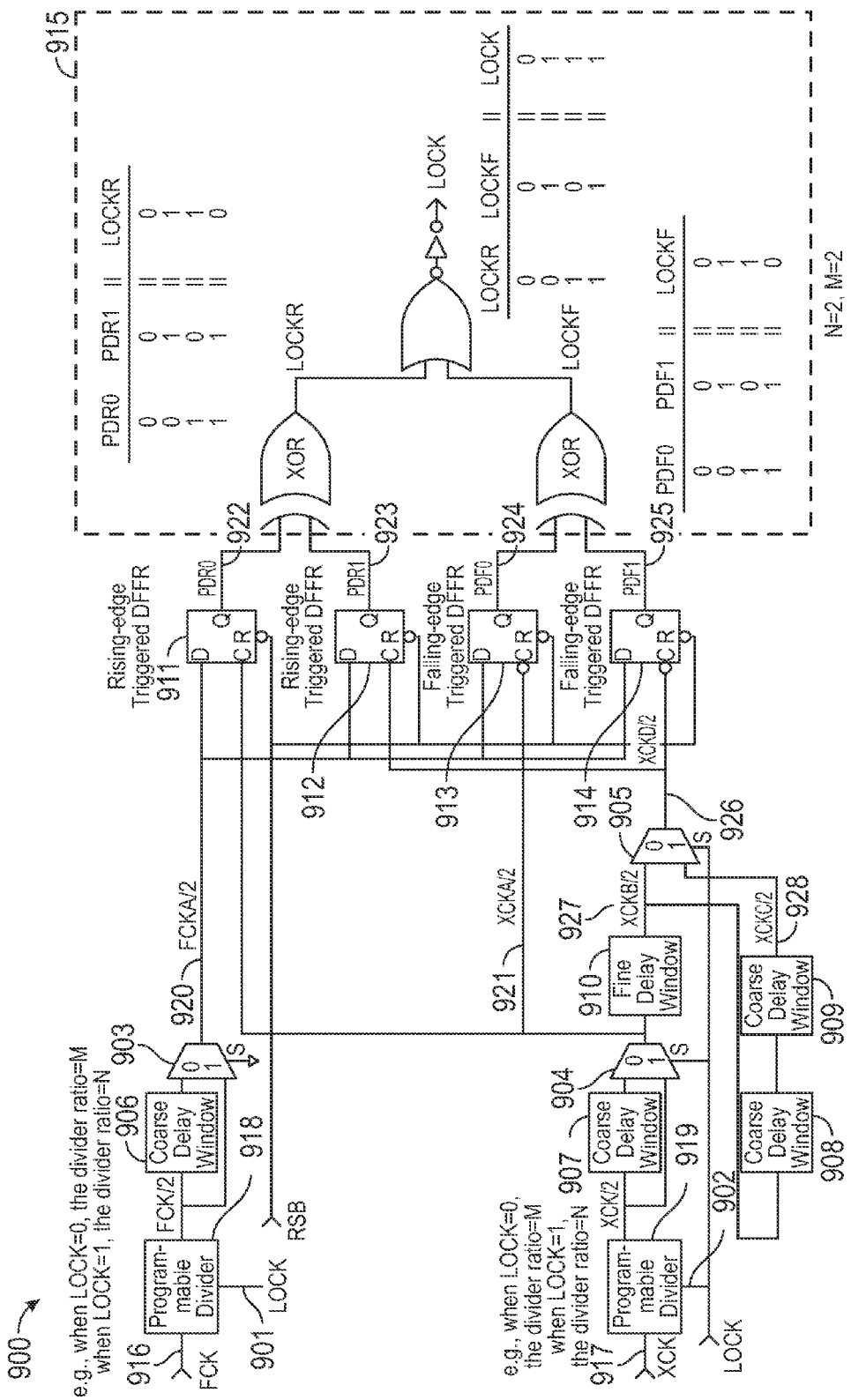
FIG. 9A illustrates a block diagram of an exemplary digital phase detector circuit consistent with certain aspects related to the innovations herein.

FIG. 9A illustrates a block diagram of an exemplary digital phase detector circuit consistent with certain aspects related to the innovations herein. Referring to FIG. 9A, exemplary circuit 900 may comprise two programmable divide-by-M/N clock dividers 901, 902, several multiplexers 903, 904, 905, a variety of delay circuits 906, 907, 908, 909, 910, flip-flops 911, 912, 913, 914, lock detection circuitry 915, and optionally other circuitry (not shown). In some implementations, the two programmable divide-by-M/N clock dividers may be first programmed to be divide-by-M dividers before the DLL reaches its phase-locked state and then may be programmed to be divide-by-N after the DLL reaches its phase-locked state. Further, the LOCK control signal from lock detection circuitry 915 may be utilized to control the programming of these two above-mentioned programmable divide-by-M/N dividers.

Figure 9B:
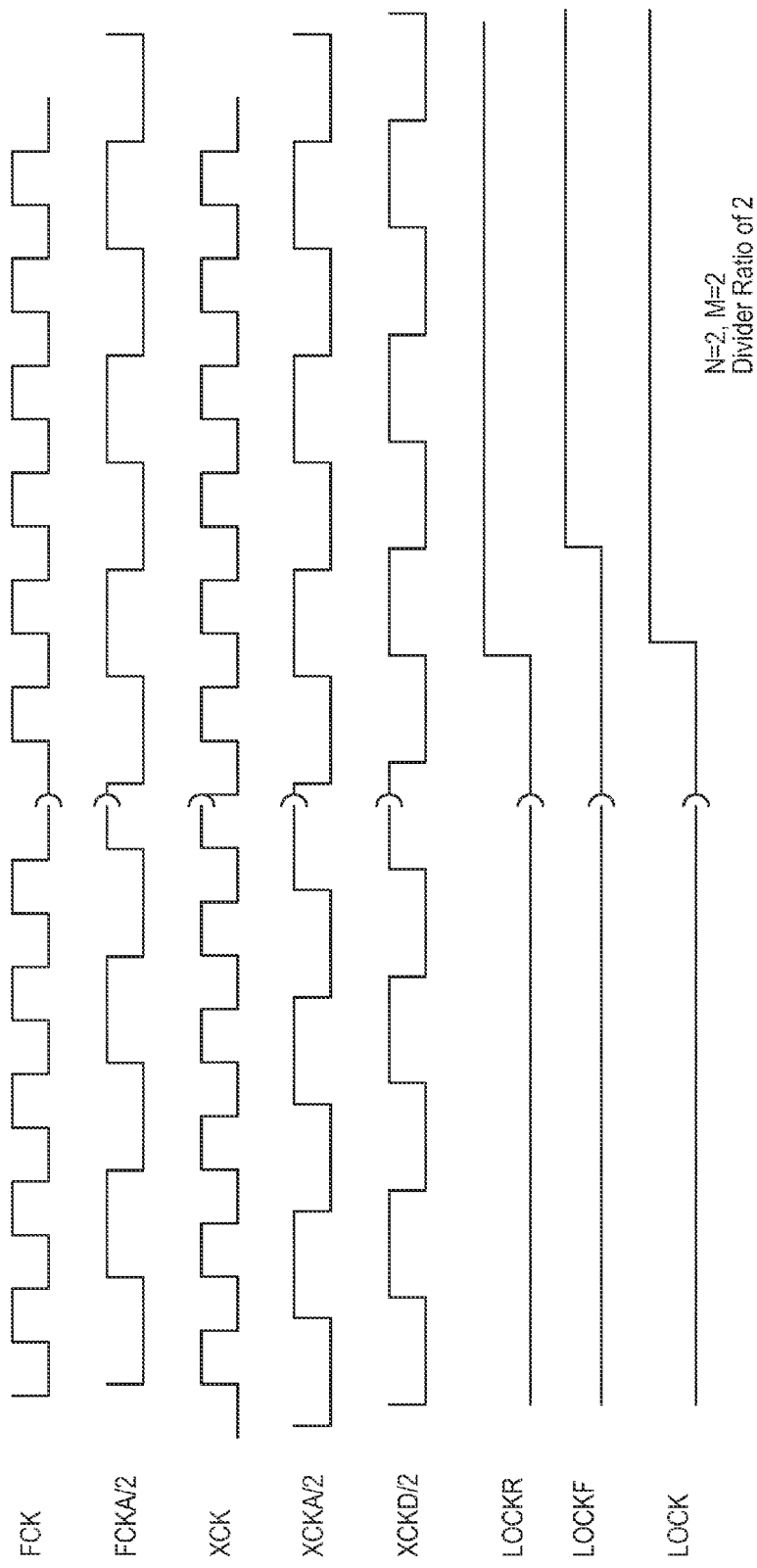
FIG. 9B depicts an illustrative waveform of exemplary digital phase detector circuitry consistent with certain aspects related to the innovations herein.

The two main clock inputs of the exemplary digital phase detector 900, shown here, are a feedback clock 916 (FCK) and a reference clock 917 (XCK). In this exemplary implementation shown here for purpose of illustration, the feedback clock 916 (FCK) is the feedback clock from the digital delay line of the delay-lock-loop circuitry. Referring to FIG. 9A, both the feedback clock signal 916 and the reference clock signal 917 are input to respective programmable divide-by-M/N clock dividers 901, 902. In one exemplary implementation, the dividers 901, 902 may be programmed to be divide-by-2/2 dividers (e.g., M=2, N=2), as set forth and explained in more detail in connection with FIG. 9B. The feedback clock signal 916 may be fed into a programmable divide-by-M/N clock divider 901, with the output 918 (FCK/2) of the programmable divide-by-M/N clock divider 901 and the output 918 passed through a coarse delay circuit 906 as inputs to a first multiplexer 903. The reference clock signal 917 may be similarly fed into a programmable divide-by-M/N clock divider 902 and second multiplexer 904, as set forth in more detail below.

The multiplexed feedback signal 920 (FCKA/2) is then provided as input to a first flip-flop 911 that is rising edge triggered, which also receives a similarly multiplexed reference signal 921 (XCKA/2) from a second multiplexer 904 as a second input. The first flip-flop output signal is then provided as a first input of the lock detection circuitry 915, first lock signal 922 (PDR0). The feedback signal 920 is also provided as input to a second flip-flop 912 that is rising-edge triggered, a third flip-flop 913 that is falling-edge triggered, and fourth flip-flop 914 that is falling-edge triggered. The third flip-flop 913 receives the multiplexed reference signal 921 as a second input while the second flip-flop 912 and fourth flip-flop 914 receive as second input a second multiplexed reference signal 926 (XCKD/2) output from third multiplexer 905. The second flip-flop signal is then provided as second lock signal 923 (PDR1) input to the lock detection circuitry 915. Likewise, the third flip-flop signal and fourth flip-flop signal are provided as third lock signal 924 (PDF0) and fourth lock signal 925 (PDF1), respectively, input to the lock detection circuitry 915.

With regard to the reference clock processing circuitry, the reference clock signal 917 may similarly be fed into a programmable divide-by-M/N clock divider 902, with the output 919 (XCK/2) of the programmable divide-by-M/N clock divider 902 and the output 919 passed through a coarse delay circuit 907 as inputs to a second multiplexer 904. The multiplexed reference signal 921 (XCKA/2) is then provided as input to a fine delay circuit 910. The fine delay circuit 910 outputs a signal 927 (XCKB/2) as first input to third multiplexer 905. A second input 928 (XCKC/2) to the third multiplexer 905 is derived from signal 927 input through coarse delay circuits 908, 909.

In FIGS. 9-14, the programmable clock dividers are always enabled during DLL operation to operate at a reduced clock speed all the time. This not only reduces power consumption, but also enhances the timing margin even before detection of a phase-locking condition. In addition, the reference clock divider will generate the multi-phase output clocks running at the same divided down speed depending upon the selected divider ratio (e.g. M=2, 3, 4, etc.) to maintain the minimum locking time of the DLL and these multi-phase output clocks will have the phase difference of either a full clock cycle or multiple clock cycles. Furthermore, the rising edges and the falling edges of the output clocks for both feedback clock divider and reference clock divider can be utilized to achieve the minimum locking time of the DLL operation. The timing waveforms of circuit 900 with M=2 and N=2 is shown in FIG. 9B.

After the digital DLL is phase-locked, the two above-mentioned clock dividers can either remain with the same divider ratio of M or be further divided down to a new ratio of N where the N can be a multiple integer of M (e.g. 1M, 2M, 3M, 4M, etc.) depending on the clock speed requirements of the DLL design. For example, if the clock speed is moderately fast, such as less than 500 M Hertz rate, the dividers can remain as a ratio of M after the digital phase lock condition is achieved. However, if the clock speed is very fast, such as greater than 500 M Hertz rate, the divider ratio can be further divided down to N, where N is a multiple integer of M after the digital phase locking condition is met.

Furthermore, after the digital DLL is phase-locked, a large phase detection window will be activated regardless of the divider ratio of N that is selected. With a larger phase detection window, the analog locking range of the mixed-mode DLL can operate within a wider timing delay range to further optimize jitter performance. However, with a larger phase detection window, the DPD may have a very tight timing margin for its phase-sampling process even under moderately high-speed DLL operations such as the clock speed of 500 M Hertz or less. Therefore, this further divided down feature of this new DPD will provide even more timing margin and power saving capability for the extremely high-speed mixed-mode DLL design. Consistent with these adaptation features, aspects of the innovations here may improve digital phase detector and/or mixed-mode DLL design to achieve better overall performance.

Figure 10A:
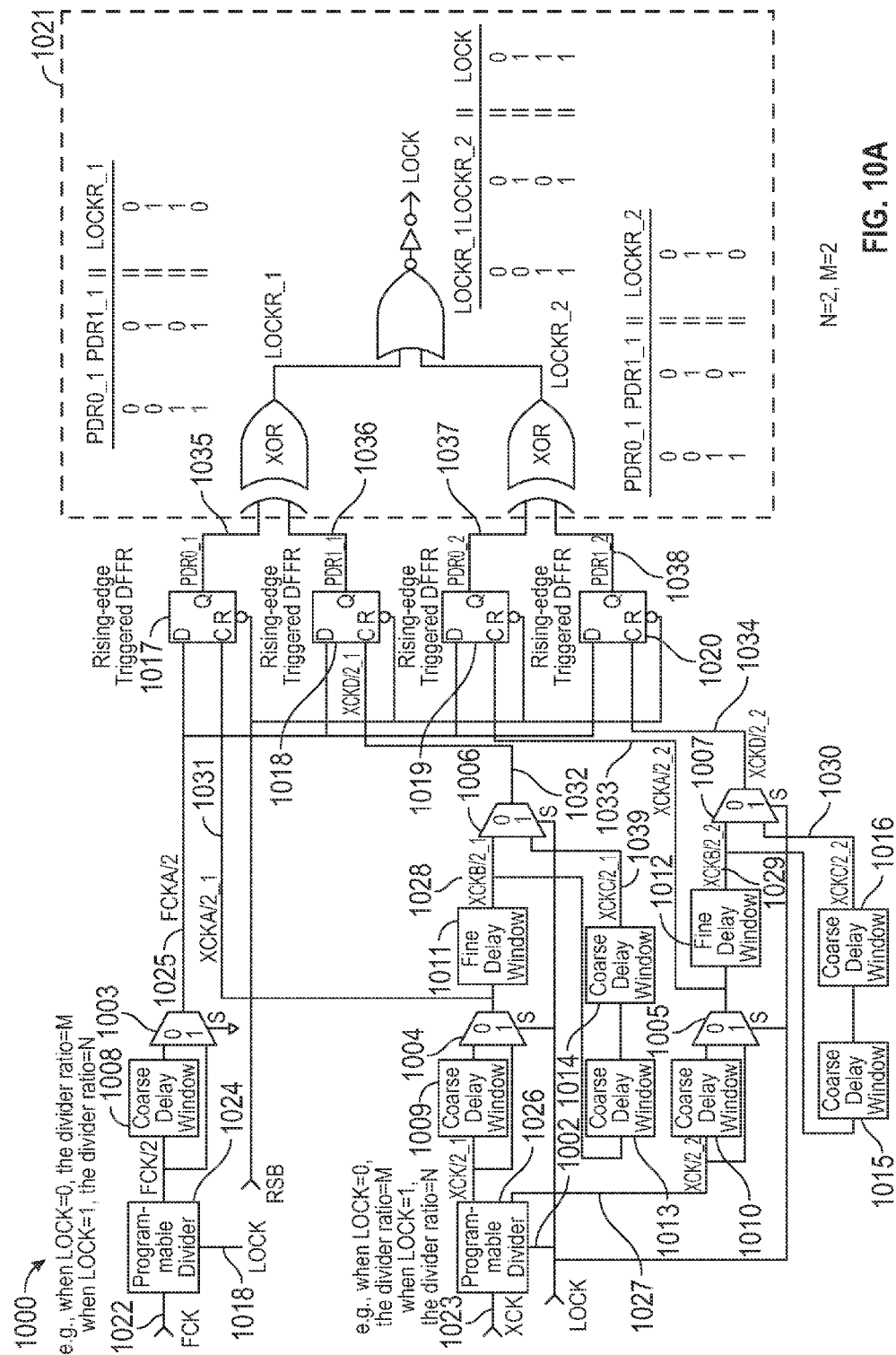
FIG. 10A illustrates a block diagram of an exemplary digital phase detector circuit consistent with certain aspects related to the innovations herein.

FIG. 10A illustrates a block diagram of an exemplary digital phase detector circuit consistent with certain aspects related to the innovations herein. Referring to FIG. 10A, exemplary circuit 1000 may comprise two programmable divide-by-M/N clock dividers 1001, 1002, several multiplexers 1003, 1004, 1005, 1006, 1007, a variety of delay circuits 1008, 1009, 1010, 1011, 1012, 1013, 1014, 1015, 1016, flip-flops 1017, 1018, 1019, 1020, lock detection circuitry 1021, and optionally other circuits (not shown). In some implementations, the two programmable divide-by-M/N clock dividers may be first programmed to be divide-by-M dividers before the DLL reaches its phase-locked state and then may be programmed to be divide-by-N after the DLL reaches its phase-locked state. Further, the LOCK control signal from lock detection circuitry 1021 may be utilized to control the programming of these two above-mentioned programmable divide-by-M/N dividers.

Figure 10B:
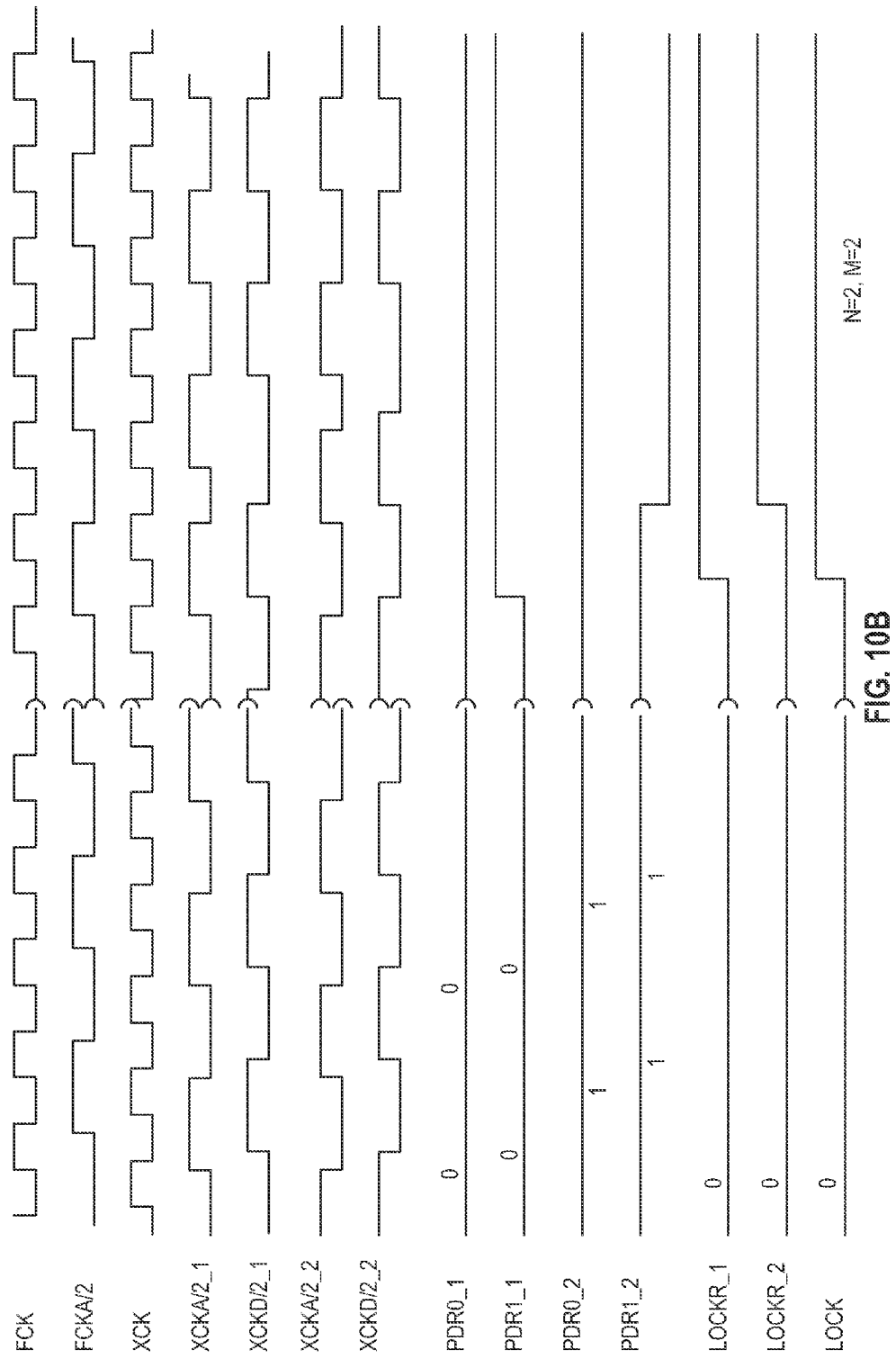
FIG. 10B depicts an illustrative waveform of exemplary digital phase detector circuitry consistent with certain aspects related to the innovations herein.

The two main clock inputs of the exemplary digital phase detector 1000, shown here, are a feedback clock 1022 (FCK) and a reference clock 1023 (XCK). In this exemplary implementation, the feedback clock 1022 (FCK) is the feedback clock from the digital delay line of the delay-lock-loop circuitry. Referring to FIG. 10B, both the feedback clock signal 1022 and the reference clock signal 1023 are input to respective divide-by-N clock dividers 1001, 1002. In one exemplary implementation, the dividers 1001, 1002 may be programmed to be divide-by-2/2 dividers (e.g., M=2, N=2), as set forth and explained in more detail in connection with FIG. 10B. The feedback clock signal 1022 may be fed into a divide-by-N clock divider 1001, with the output 1024 (FCK/2) of the programmable divide-by-M/N clock divider 1001 and the output 1024 passed through a coarse delay circuit 1008 as inputs to a first multiplexer 1003. The reference clock signal 1023 may be similarly fed into a programmable divide-by-M/N clock divider 1002 and second multiplexer 1004, as set forth in more detail below.

The multiplexed feedback signal 1025 (FCKA/2) is then provided as input to a first flip-flop 1017 that is rising edge triggered, which also receives a similarly multiplexed reference signal 1031 (XCKA/2_1) from a second multiplexer 1004 as a second input. The first flip-flop output signal is then provided as a first input of the lock detection circuitry 1021, first lock signal 1035 (PDR0_1). The feedback signal 1025 is also provided as input to a second flip-flop 1018 that is rising-edge triggered, a third flip-flop 1019 that is rising-edge triggered, and fourth flip-flop 1020 that is rising-edge triggered. The second flip-flop 1018 receives the multiplexed reference signal 1032 (XCKD/2_1) as a second input while the third flip-flop 1019 receives the multiplexed reference signal 1033 (XCKA/2_2) as second input and the fourth flip-flop 1020 receives the multiplexed reference signal 1034 (XCKD/2_2) as second input. The second flip-flop signal is then provided as second lock signal 1036 (PDR1_1) input to the lock detection circuitry 1021. Likewise, the third flip-flop signal and fourth flip-flop signal are provided as third lock signal 1037 (PDR0_2) and fourth lock signal 1038 (PDR1_2), respectively, input to the lock detection circuitry 1021.

With regard to the reference clock processing circuitry, the reference clock signal 1023 may similarly be fed into a programmable divide-by-M/N clock divider 1002, with the output 1026 (XCK/2_1) of the programmable divide-by-M/N clock divider 1002 and the output 1026 passed through a coarse delay circuit 1009 provided as inputs to a second multiplexer 1004. The multiplexed reference signal 1031 (XCKA/2_1) is then provided as input to a fine delay circuit 1011. The output 1028 (XCKB/2_1) of the fine delay circuit 1011 is then provided as a first input to a fourth multiplexer 1006, which outputs the multiplexed reference signal 1032 (XCKD/2_1). The output 1028 is fed through coarse delay circuits 1013, 1014 to provide a second input 1039 (XCKC/2_1) to the fourth multiplexer 1006.

Next, a second output 1027 (XCK/2_2) of the programmable divide-by-M/N clock divider 1002 is provided to coarse delay circuit 1010 and a second input of a third multiplexer 1005. The output of the coarse delay circuit 1010 is a first input of the third multiplexer 1005. The output 1033 (XCKA/2_2) of the third multiplexer 1005 is provided as input to third flip-flop 1037 and to fine delay circuit 1012. The output 1029 (XCKB/2_2) of the fine delay circuit 1012 is provided as first input to fifth multiplexer 1007. Output 1029 is further input through coarse delay circuits 1015, 1016 to provide output 1030 (XCKC/2_2) as a second input to the fifth multiplexer 1007. The timing waveforms of circuit 1000 with M=2 and N=2 is shown in FIG. 10B.

Figure 11A:
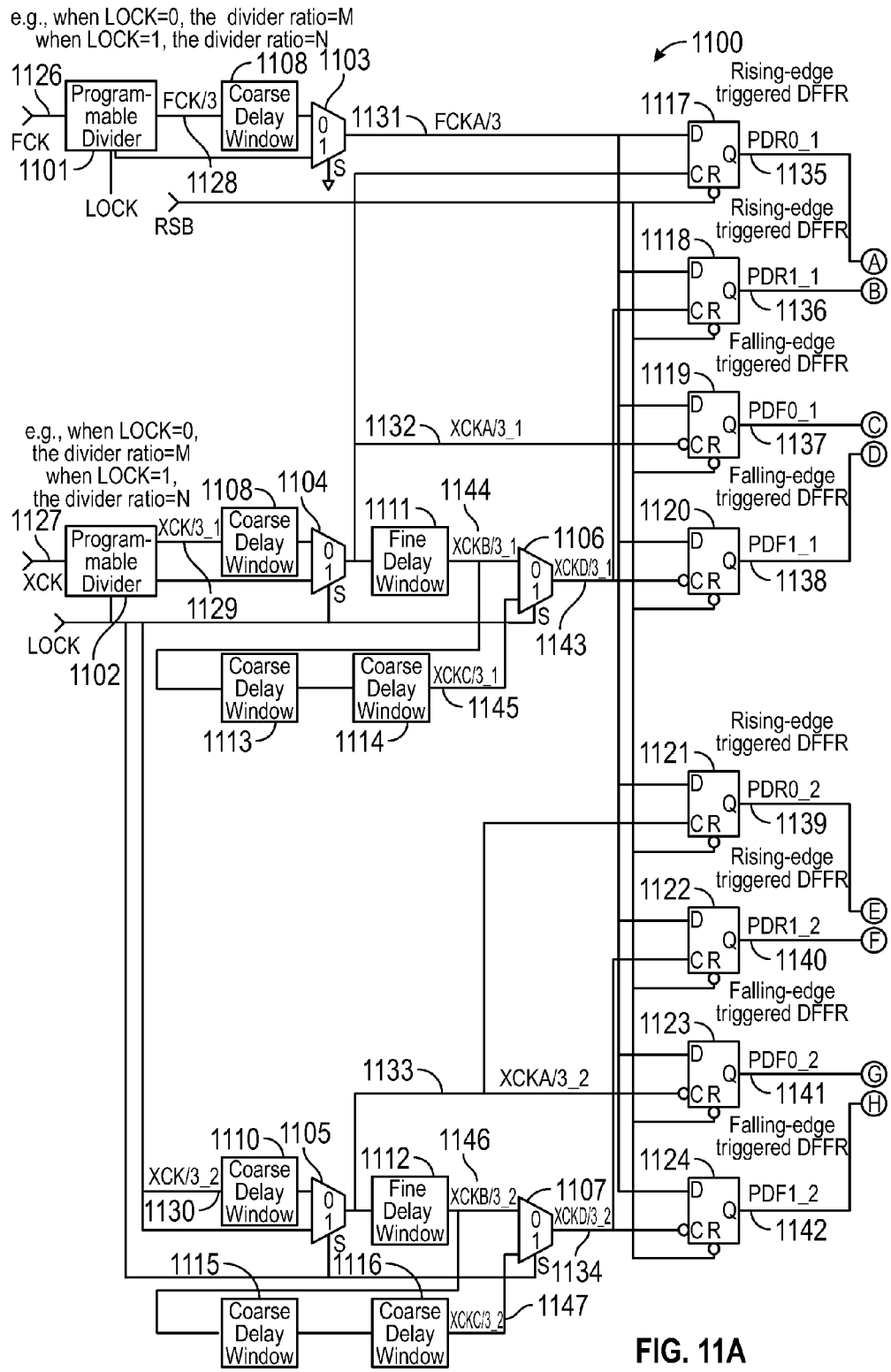
FIG. 11A illustrates a block diagram of an exemplary digital phase detector circuit consistent with certain aspects related to the innovations herein.
Figure 11B:
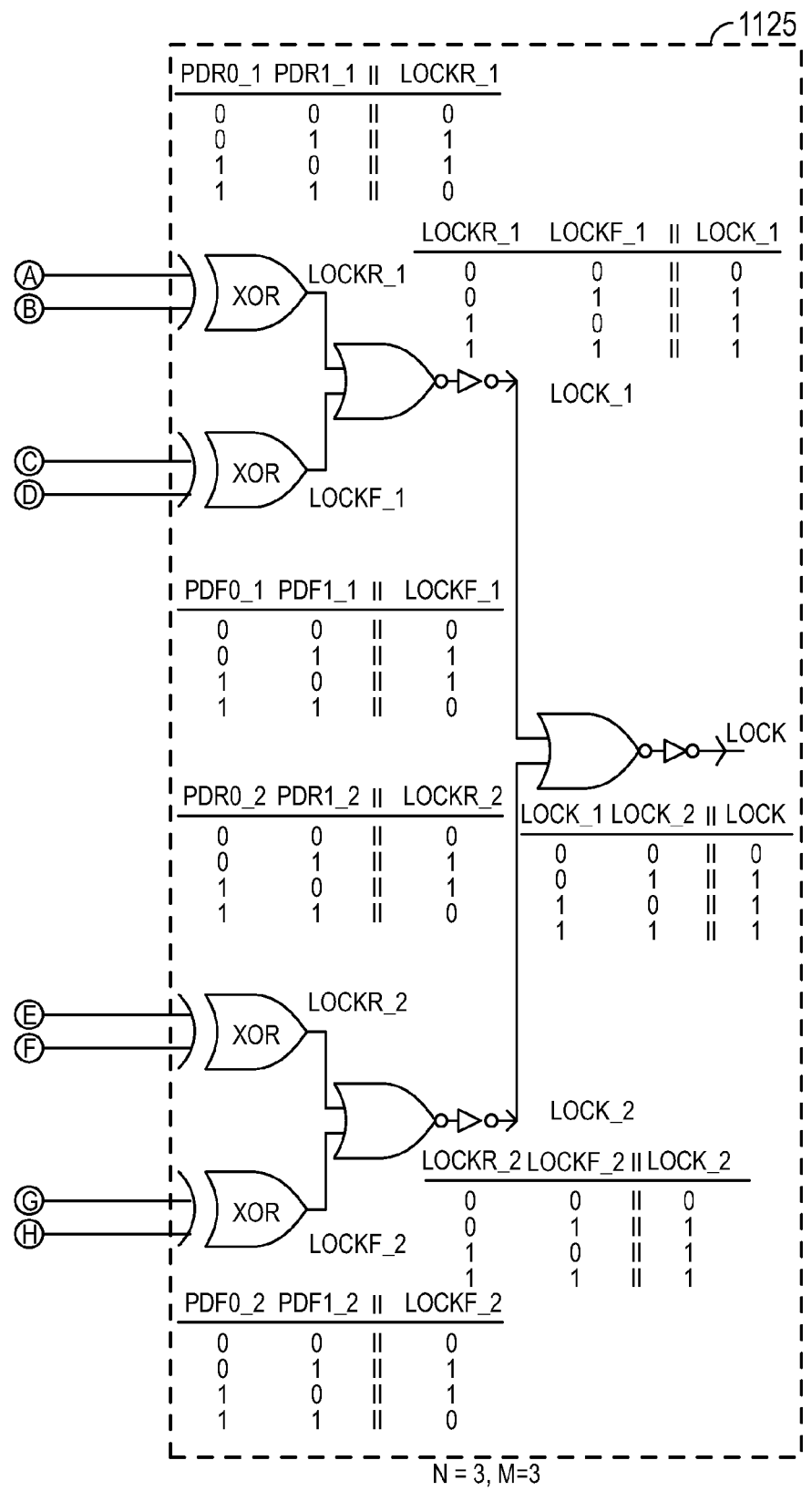
FIG. 11B depicts an illustrative block diagram of exemplary digital phase detector circuitry consistent with certain aspects related to the innovations herein.

FIGS. 11A and 11B illustrate block diagrams of an exemplary digital phase detector circuit consistent with certain aspects related to the innovations herein. Referring to FIG. 11A, exemplary circuit 1100 may comprise two programmable divide-by-M/N clock dividers 1101, 1102, several multiplexers 1103, 1104, 1105, 1106, 1107, a variety of delay circuits 1109, 1110, 1111, 1112, 1113, 1114, 1115, 1116, flip-flops 1117, 1118, 1119, 1120, 1121, 1122, 1123, 1124, lock detection circuitry 1125, and optionally other circuits (not shown). In some implementations, the two programmable divide-by-M/N clock dividers may be first programmed to be divide-by-M dividers before the DLL reaches its phase-locked state and then may be programmed to be divide-by-N after the DLL reaches its phase-locked state. The LOCK control signal from lock detection circuitry 1125 will control the programming of these two above-mentioned programmable divide-by-M/N dividers.

The two main clock inputs of the exemplary digital phase detector 1100, shown here, are a feedback clock 1126 (FCK) and a reference clock 1127 (XCK). In this exemplary implementation, the feedback clock 1126 (FCK) is the feedback clock from the digital delay line of the delay-lock-loop circuitry. Referring to FIGS. 11A and 11B, both the feedback clock signal 1126 and the reference clock signal 1127 are input to respective programmable divide-by-M/N clock dividers 1101, 1102. In one exemplary implementation, the dividers 1101, 1102 may be programmed to be divide-by-3 dividers (e.g., M=3, N=3), as set forth and explained in more detail in connection with FIG. 11B. The feedback clock signal 1126 may be fed into a programmable divide-by-M/N clock divider 1101, with the output 1128 (FCK/3) of the programmable divide-by-M/N clock divider 1101 and the output 1128 passed through a coarse delay circuit 1108 as inputs to a first multiplexer 1103. The reference clock signal 1127 may be similarly fed into a programmable divide-by-M/N clock divider 1102 and second multiplexer 1104, as set forth in more detail below.

The multiplexed feedback signal 1131 (FCKA/3) is then provided as input to a first flip-flop 1117 that is rising edge triggered, which also receives a similarly multiplexed reference signal 1132 (XCKA/3_1) from a second multiplexer 1104 as a second input. The first flip-flop output signal is then provided as a first input of the lock detection circuitry 1125, first lock signal 1135 (PDR0_1). The feedback signal 1131 is also provided as input to a second flip-flop 1118 that is rising-edge triggered, a third flip-flop 1119 that is falling-edge triggered, fourth flip-flop 1120 that is falling-edge triggered, a sixth flip-flop 1122 that is rising-edge triggered, seventh flip-flop 1123 that is falling-edge triggered and an eighth flip-flop 1124 that is falling-edge triggered. The reference signal 1132 is also provided as input to the third flip-flop 1119. The second flip-flop 1118 and fourth flip-flop 1120 receive the multiplexed reference signal 1143 (XCKD/3_1) as second inputs. The third multiplexer 1105 outputs a reference signal 1133 (XCKA/3_2) to the second inputs of the fifth flip-flop 1121 and seventh flip-flop 1123. The fifth multiplexer 1107 outputs a reference signal 1134 (XCKD/3_2) to the second inputs of the sixth flip-flop 1122 and eighth flip-flop 1124.

The second flip-flop signal is then provided as second lock signal 1136 (PDR1_1) input to the lock detection circuitry 1125. The third through eighth flip-flop signals are provided as third lock signal 1137 (PDF0_1), fourth lock signal 1138 (PDF1_1), fifth lock signal 1139 (PDR0_2), sixth lock signal 1122 (PDR1_2), seventh lock signal 1123 (PDF0_2) and eighth lock signal 1124 (PDF1_2), respectively, input to the lock detection circuitry 1125.

With regard to the reference clock processing circuitry, the reference clock signal 1127 may similarly be fed into a programmable divide-by-M/N clock divider 1102, with the output 1129 (XCK/3_1) of the programmable divide-by-M/N clock divider 1102 and the output 1129 passed through a coarse delay circuit 1109 provided as inputs to a second multiplexer 1104. The multiplexed reference signal 1132 (XCKA/3_1) is then provided as input to a fine delay circuit 1111. The output 1144 (XCKB/3_1) of the fine delay circuit 1111 is then provided as a first input to a fourth multiplexer 1106, which outputs the multiplexed reference signal 1143 (XCKD/3_1). The output 1144 is fed through coarse delay circuits 1113, 1114 to provide a second input 1145 (XCKC/3_1) to the fourth multiplexer 1106.

Next, a second output 1130 (XCK/3_2) of the programmable divide-by-M/N clock divider 1102 is provided to coarse delay circuit 1110 and a second input of a third multiplexer 1105. The output of the coarse delay circuit 1110 is a first input of the third multiplexer 1105. The output 1133 (XCKA/3_2) of the third multiplexer 1105 is provided as input to fifth flip-flop 1121 and seventh flip-flop 1123 and to fine delay circuit 1112. Output 1146 (XCKB/3_2) is further input through coarse delay circuits 1115, 1116 to provide output 1147 (XCKC/3_2) as a second input to the fifth multiplexer 1107.

Figure 12A:
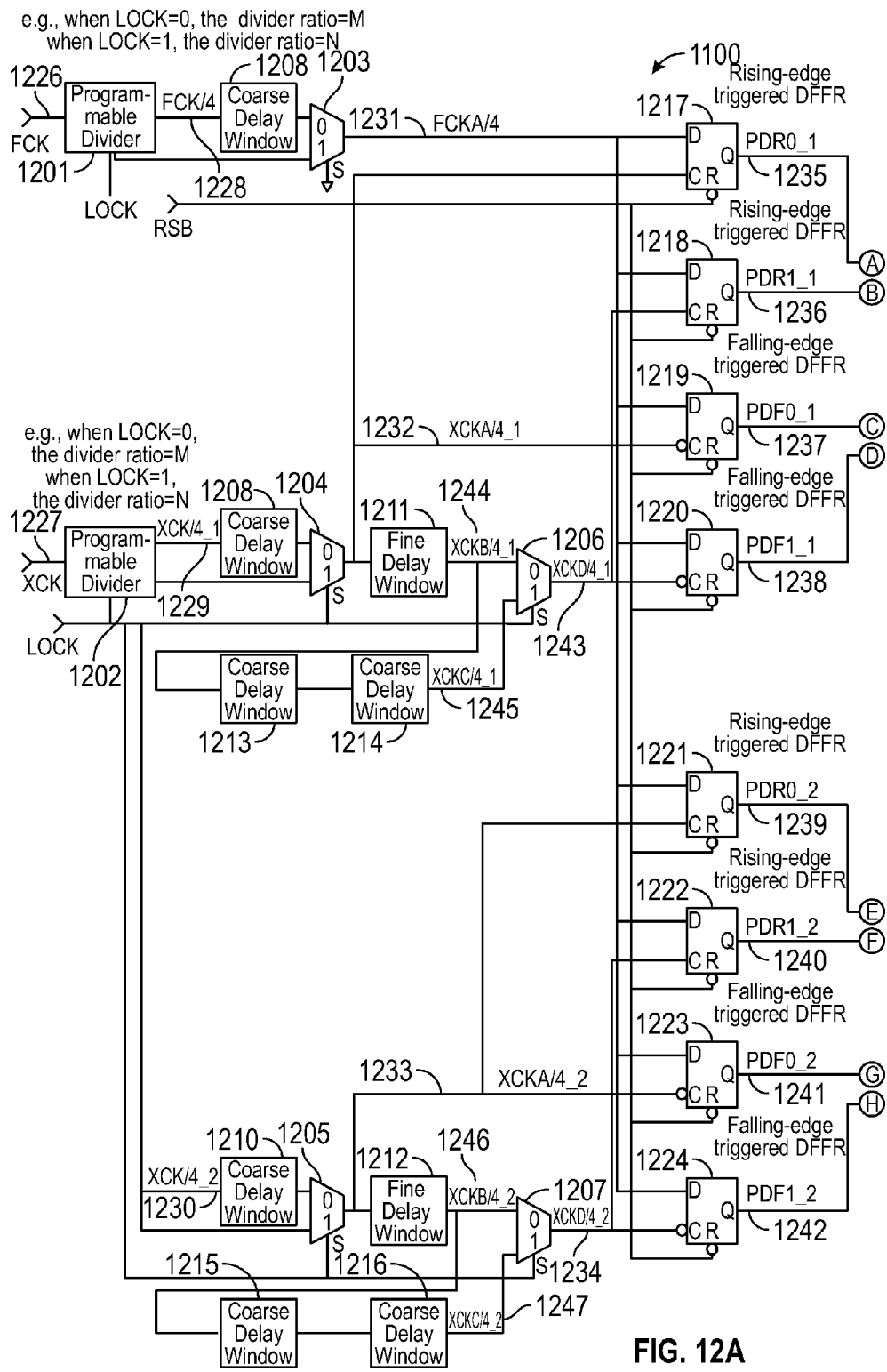
FIGS. 12A and 12B illustrate a block diagram of an exemplary digital phase detector circuit consistent with certain aspects related to the innovations herein.
Figure 12B:
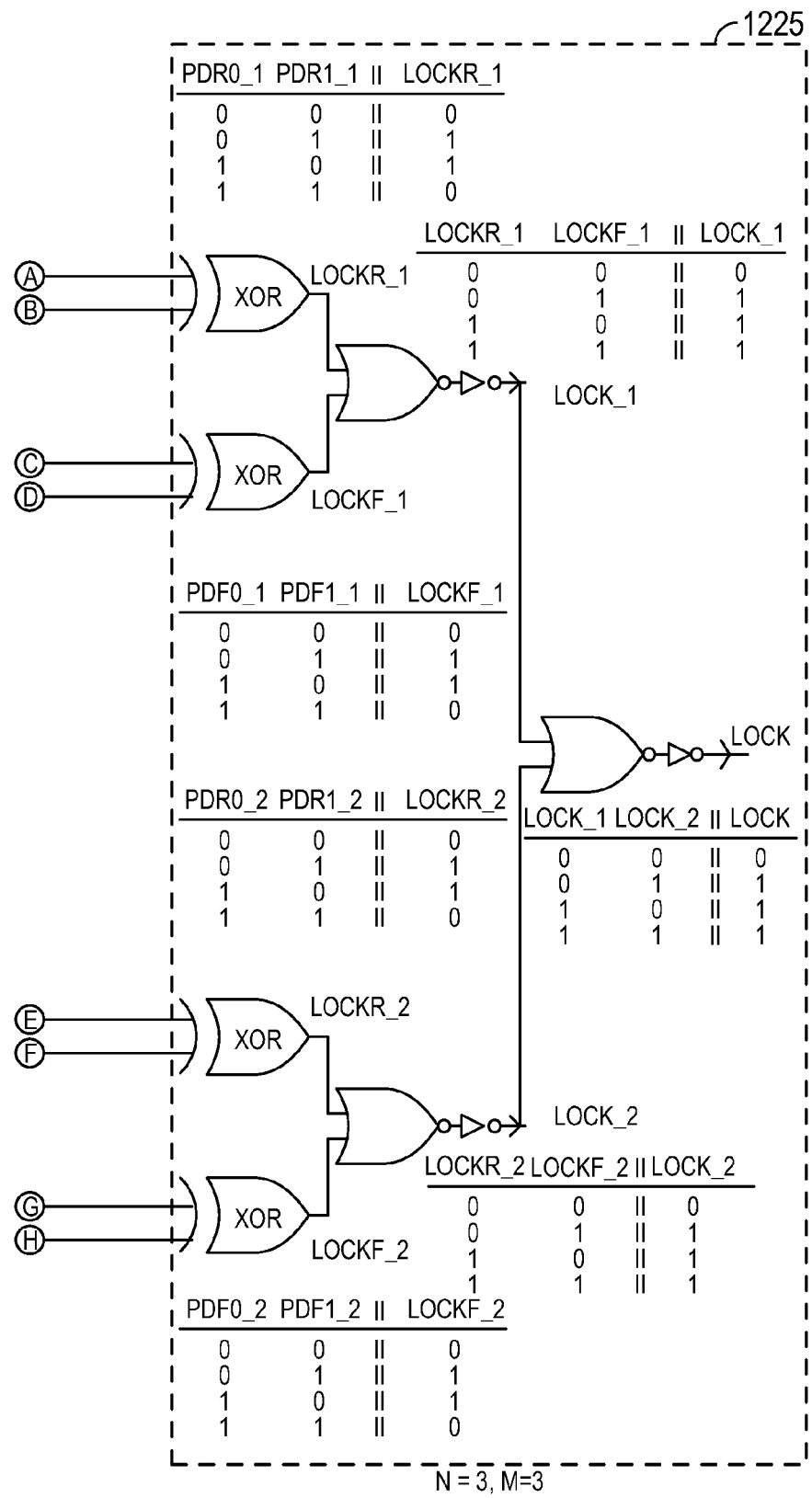

FIGS. 12A and 12B illustrate a block diagram of an exemplary digital phase detector circuit consistent with certain aspects related to the innovations herein. Referring to FIGS. 12A and 12B, exemplary circuit 1200 may comprise two programmable divide-by-M/N clock dividers 1201, 1202, several multiplexers 1203, 1204, 1205, 1206, 1207, a variety of delay circuits 1209, 1210, 1211, 1212, 1213, 1214, 1215, 1216, flip-flops 1217, 1218, 1219, 1220, 1221, 1222, 1223, 1224, lock detection circuitry 1225, and optionally other circuits (not shown). In some implementations, the two programmable divide-by-M/N clock dividers may be first programmed to be divide-by-M dividers before the DLL reaches its phase-locked state and then may be programmed to be divide-by-N after the DLL reaches its phase-locked state. Further, the LOCK control signal from lock detection circuitry 1225 may be utilized to control the programming of these two above-mentioned programmable divide-by-M/N dividers.

The two main clock inputs of the exemplary digital phase detector 1100, shown here, are a feedback clock 1226 (FCK) and a reference clock 1227 (XCK). In this exemplary implementation, the feedback clock 1226 (FCK) is the feedback clock from the digital delay line of the delay-lock-loop circuitry. Referring to FIG. 12A, both the feedback clock signal 1226 and the reference clock signal 1227 are input to respective divide-by-N clock dividers 1201, 1202. In one exemplary implementation, the dividers 1201, 1202 may be programmed to be divide-by-4 dividers (e.g., M=4, N=4), as set forth and explained in more detail in connection with FIGS. 12A-C. The feedback clock signal 1226 may be fed into a programmable divide-by-M/N clock divider 1201, with the output 1228 (FCK/4) of the programmable divide-by-M/N clock divider 1201 and the output 1228 passed through a coarse delay circuit 1208 as inputs to a first multiplexer 1203. The reference clock signal 1227 may be similarly fed into a programmable divide-by-M/N clock divider 1202 and second multiplexer 1204, as set forth in more detail below.

The multiplexed feedback signal 1231 (FCKA/4) is then provided as input to a first flip-flop 1217 that is rising edge triggered, which also receives a similarly multiplexed reference signal 1232 (XCKA/4_1) from a second multiplexer 1204 as a second input. The first flip-flop output signal is then provided as a first input of the lock detection circuitry 1225, first lock signal 1235 (PDR0_1). The feedback signal 1231 is also provided as input to a second flip-flop 1218 that is rising-edge triggered, a third flip-flop 1219 that is falling-edge triggered, fourth flip-flop 1220 that is falling-edge triggered, a sixth flip-flop 1222 that is rising-edge triggered, seventh flip-flop 1223 that is falling-edge triggered and an eighth flip-flop 1224 that is falling-edge triggered. The reference signal 1232 is also provided as input to the third flip-flop 1219. The second flip-flop 1218 and fourth flip-flop 1220 receive the multiplexed reference signal 1243 (XCKD/4_1) as second inputs. The third multiplexer 1205 outputs a reference signal 1233 (XCKA/4_2) to the second inputs of the fifth flip-flop 1221 and seventh flip-flop 1223. The fifth multiplexer 1207 outputs a reference signal 1234 (XCKD/4_2) to the second inputs of the sixth flip-flop 1222 and eighth flip-flop 1224.

The second flip-flop signal is then provided as second lock signal 1236 (PDR1_1) input to the lock detection circuitry

1225. The third through eighth flip-flop signals are provided as third lock signal 1237 (PDF0_1), fourth lock signal 1238 (PDF1_1), fifth lock signal 1239 (PDR0_2), sixth lock signal 1222 (PDR1_2), seventh lock signal 1223 (PDF0_2) and eighth lock signal 1224 (PDF1_2), respectively, input to the lock detection circuitry 1225.

With regard to the reference clock processing circuitry, the reference clock signal 1227 may similarly be fed into a programmable divide-by-M/N clock divider 1202, with the output 1229 (XCK/4_1) of the programmable divide-by-M/N clock divider 1202 and the output 1229 passed through a coarse delay circuit 1209 provided as inputs to a second multiplexer 1204. The multiplexed reference signal 1232 (XCKA/4_1) is then provided as input to a fine delay circuit 1211. The output 1244 (XCKB/4_1) of the fine delay circuit 1211 is then provided as a first input to a fourth multiplexer 1206, which outputs the multiplexed reference signal 1243 (XCKD/4_1). The output 1244 is fed through coarse delay circuits 1213, 1214 to provide a second input 1245 (XCKC/4_1) to the fourth multiplexer 1206.

Figure 12C:
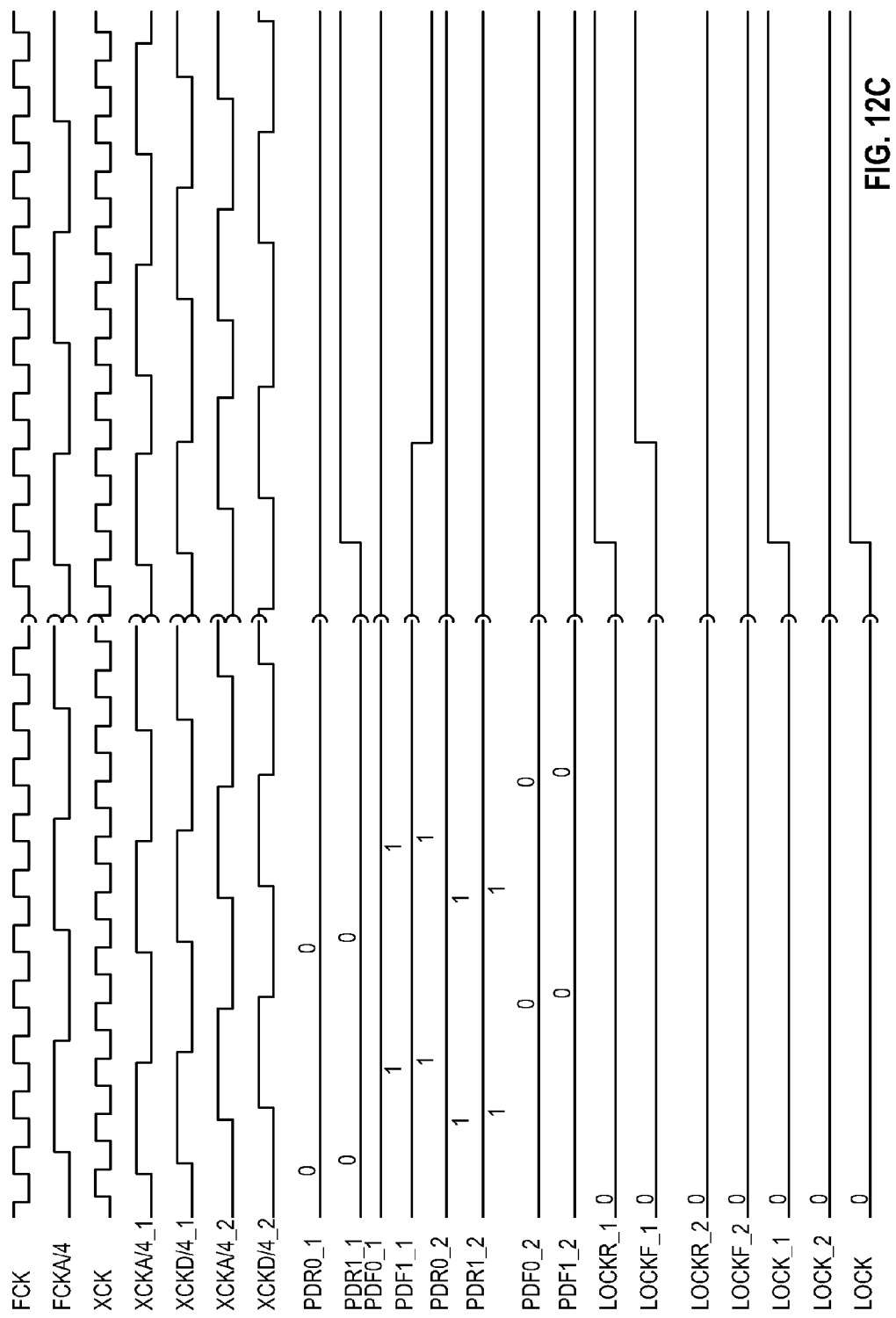
FIG. 12C depicts an illustrative waveform of exemplary digital phase detector circuitry consistent with certain aspects related to the innovations herein.

Next, a second output 1230 (XCK/4_2) of the programmable divide-by-M/N clock divider 1202 is provided to coarse delay circuit 1210 and a second input of a third multiplexer 1205. The output of the coarse delay circuit 1210 is a first input of the third multiplexer 1205. The output 1233 (XCKA/4_2) of the third multiplexer 1205 is provided as input to fifth flip-flop 1221 and seventh flip-flop 1223 and to fine delay circuit 1212. Output 1246 (XCKB/4_2) is further input through coarse delay circuits 1215, 1216 to provide output 1247 (XCKC/4_2) as a second input to the fifth multiplexer 1207. The timing waveforms of circuit 1200 with M=4 and N=4 is shown in FIG. 12C.

Figure 13A:
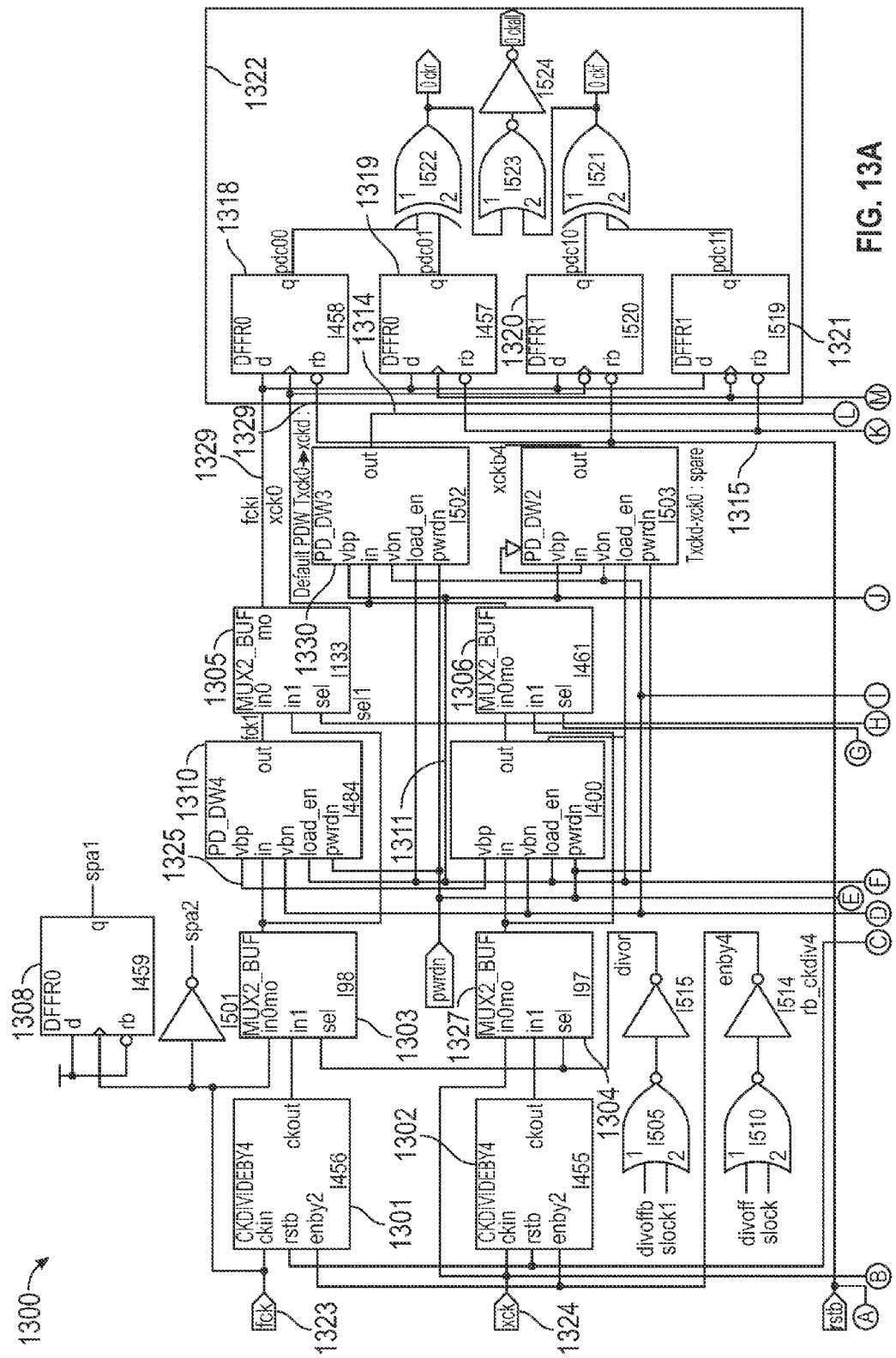
FIGS. 13A and 13B illustrate a block diagram of an exemplary digital phase detector circuit consistent with certain aspects related to the innovations herein.
Figure 13B:
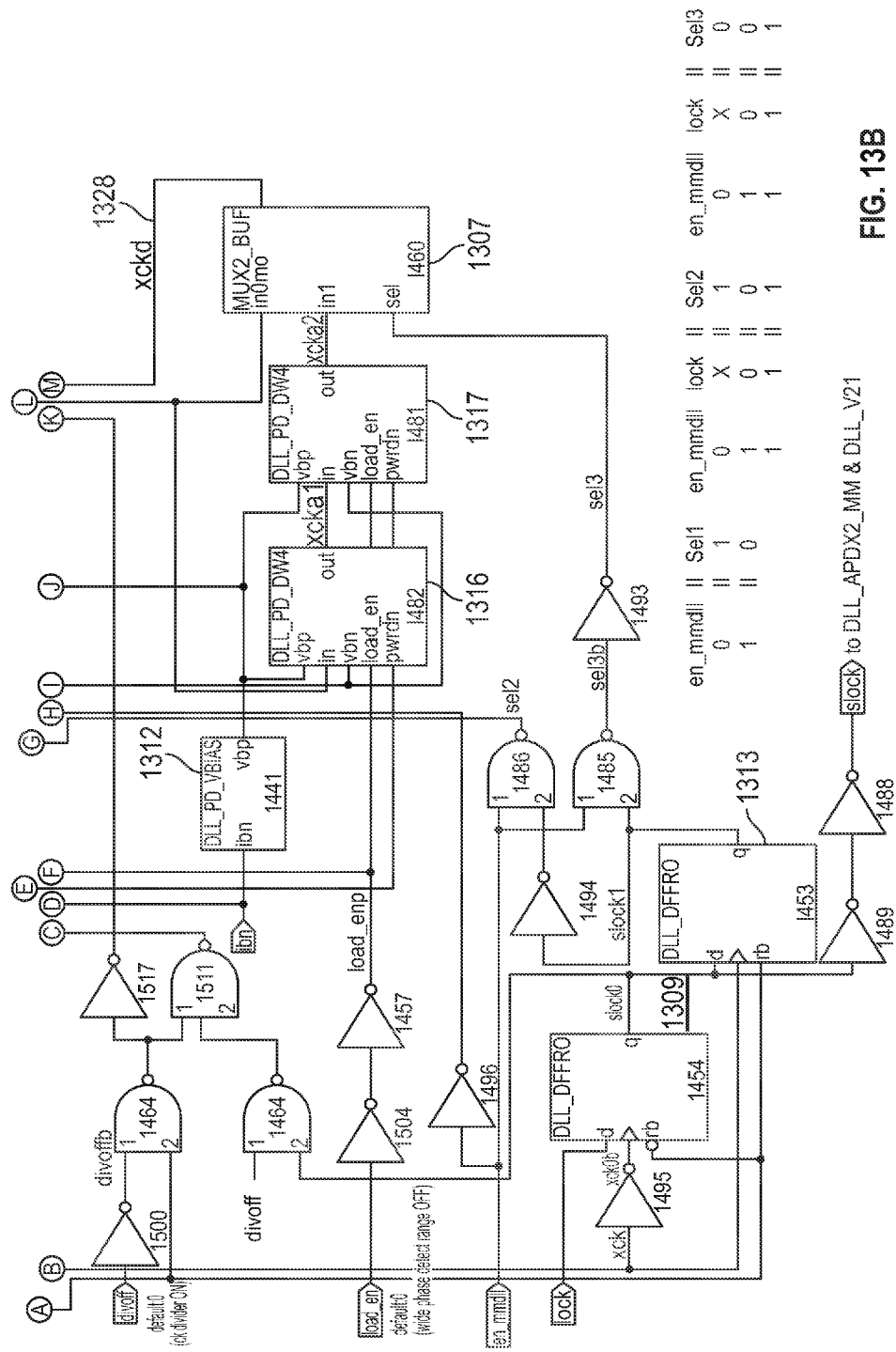

FIG. 13 illustrates a block diagram of an exemplary digital phase detector circuit consistent with certain aspects related to the innovations herein. Referring to FIG. 13, exemplary circuit 1300 may comprise two divide-by-N clock dividers 1301, 1302, several multiplexers 1303, 1304, 1305, 1306, 1307, a variety of delay circuits 1308, 1309, 1310, 1311, 1312, 1313, 1314, 1315, 1316, 1317, flip-flops 1318, 1319, 1320, 1321, lock detection circuitry 1322, and optionally other circuits (not shown). According to some implementations, the two divide-by-N clock dividers may be first programmed to bypass the divide-by-N dividers before the DLL reaches its phase-locked state and then may be programmed to be divide-by-N after the DLL reaches its phase-locked state. Further, the LOCK control signal from lock detection circuitry 1322 may be utilized to control the programming of these two above-mentioned programmable divide-by-N dividers.

The two main clock inputs of the exemplary digital phase detector 1300, shown here, are a feedback clock 1323 (fck) and a reference clock 1324917 (xck). In this exemplary implementation, the feedback clock 1323 is the feedback clock from the digital delay line of the delay-lock-loop circuitry. Referring to FIG. 13, both the feedback clock signal 1323 and the reference clock signal 1324 are input to respective divide-by-N clock dividers 1301, 1302. In one exemplary implementation, the dividers 1301, 1302 may be N=2 dividers, as set forth and explained in more detail in connection with FIG. 14. The feedback clock signal 1323 may be fed into a divide-by-N clock divider 1301, with the output input to a first multiplexer 1303. The output 1325 (fck0) of the multiplexer 1303 and the output 1325 passed through a delay circuit 1310 as inputs to a third multiplexer 1305. The first flip-flop 1318, second flip-flop 1319, third flip-flop 1320 and fourth flip-flop 1321 receives an input signal 1329 (fcki) from the third multiplexer 1305 and input 1330 (xck0) from fourth multiplexer 1306 as a second input.

The multiplexed feedback signal 1327 (xckb0) and the output 1327 are passed through a delay circuit 1311 as inputs to a fourth multiplexer 1306. The output of the fourth multiplexer 1306 is then provided to the delay circuit 1314 which outputs a signal to the fifth multiplexer 1307. The fifth multiplexer 1307 outputs a multiplexed reference signal 1328 (xckd) to the second flip-flop 1319 and fourth flip-flop 1321.

Figure 14:
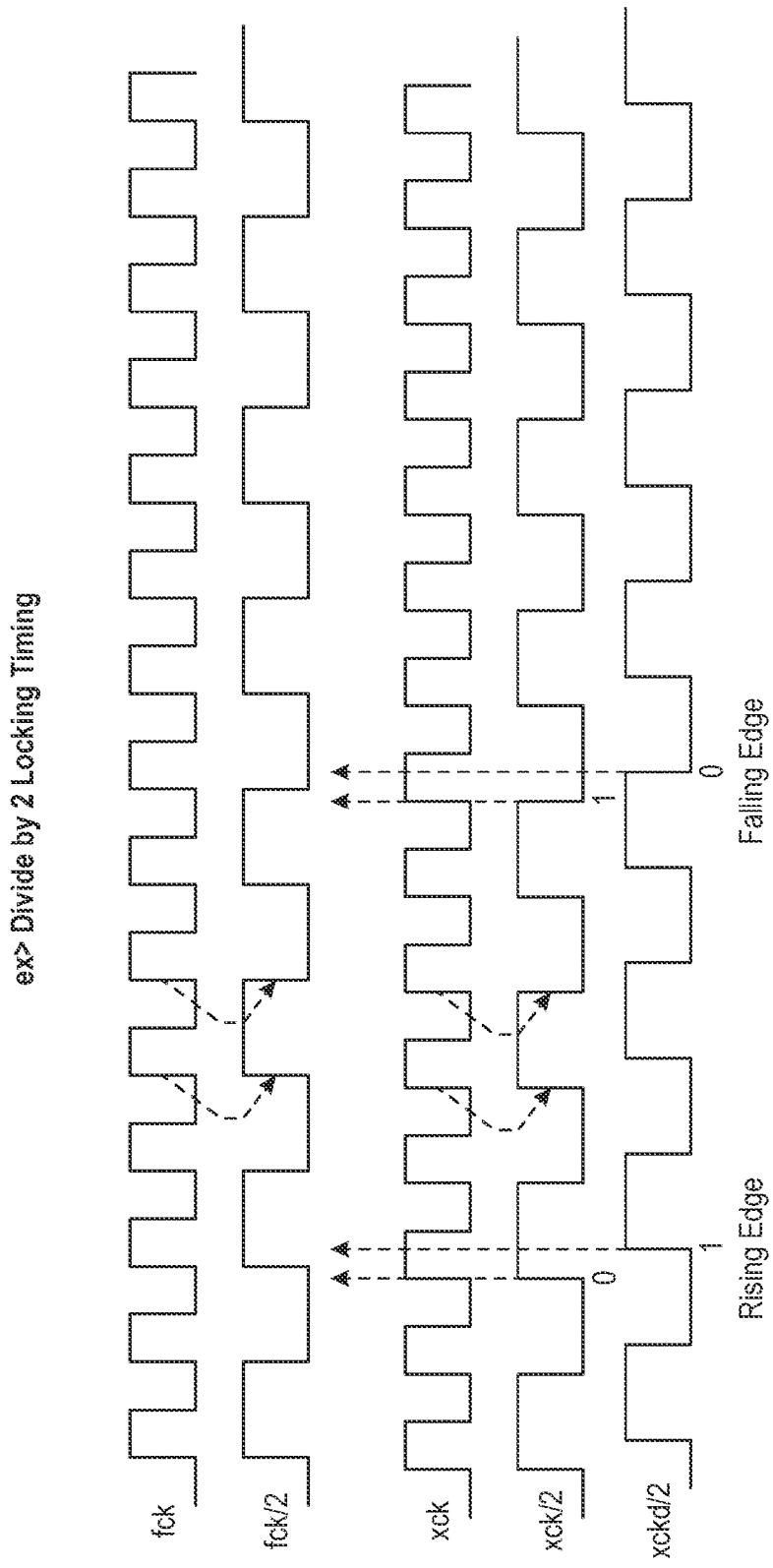
FIG. 14 depicts an illustrative waveform of exemplary digital phase detector circuitry consistent with certain aspects related to the innovations herein.

With regard to the reference clock processing circuitry, the reference clock signal 1324 may similarly be fed into a divide-by-N clock divider 1302, with the output input to second multiplexer 1304. The output 1327 (xckb0) of the divide-by-N clock divider 1302 and the output 1327 passed through a delay circuit 1311 are input to a fourth multiplexer 1306. The timing waveforms of circuit with divide by two locking timing is shown in FIG. 14.

Figure 15:
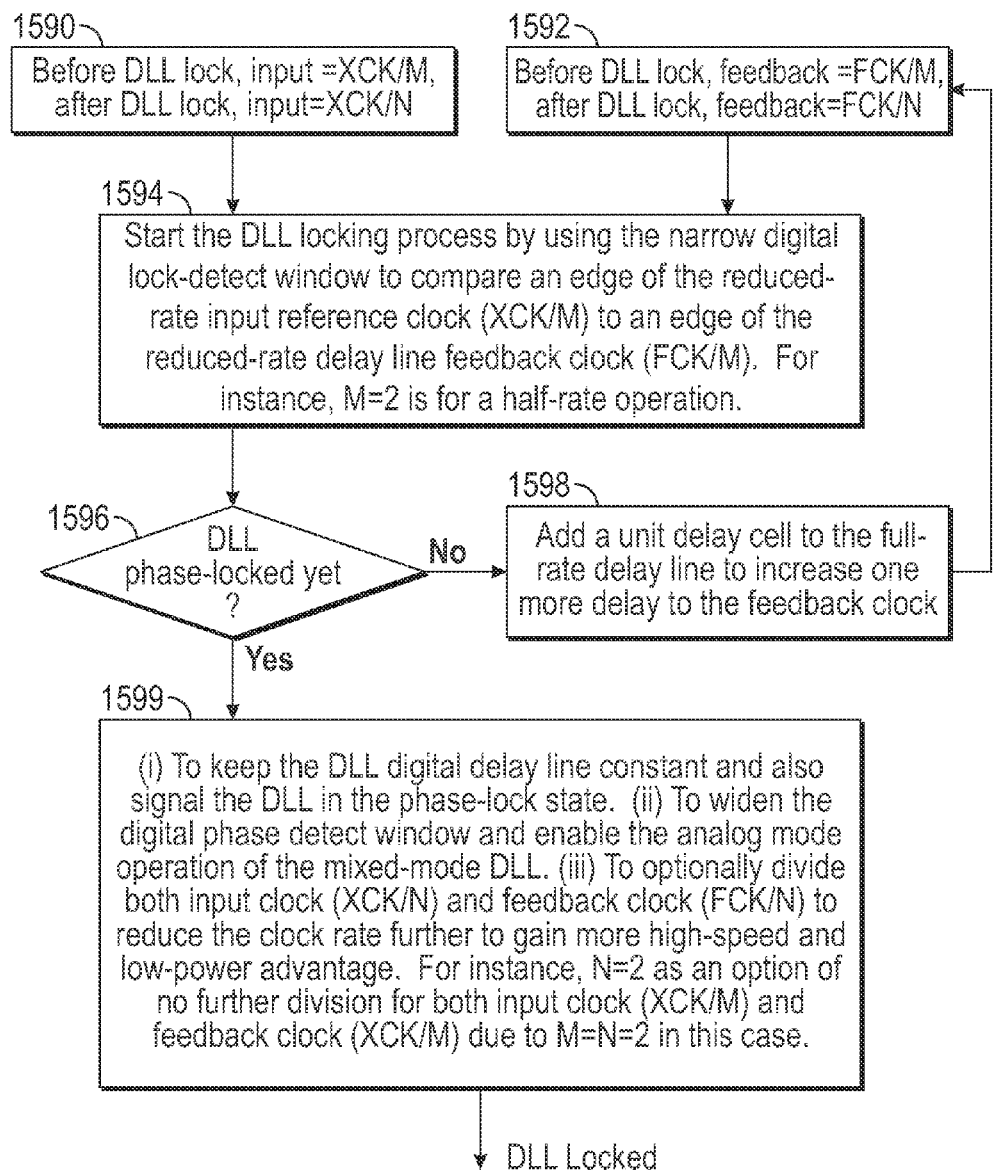
FIG. 15 is a flow diagram showing exemplary aspects of lock initiating and maintaining processing consistent with certain aspects related to the innovations of FIGS. 9A-14.

FIG. 15 is a flow diagram showing exemplary aspects of lock initiating and maintaining processing consistent with certain aspects related to the innovations of FIGS. 9A-14. FIG. 15 illustrates various features of operation of a new adaptive digital phase detector (DPD) and/or digital/analog mixed-mode phase detection aspects. At 1590, it is shown that input reference clock XCK is operating at reduced 1/Mth rate of XCK (e.g. XCK/M) even before the DLL reaches its phase-locked state and will optionally operate at a further reduced 1/Nth-rate of XCK (e.g. XCK/N) when the DLL reaches its phase-locked state. Next, at 1594, the DPD may utilize a narrow lock-detect window to compare the edges (e.g. both rising edges and falling edges) of the 1/Mth-rate input reference clock (e.g. XCK/M) to the edges (e.g. both rising edges and falling edges) of the reduced-rate delay line feedback clock (e.g. FCK/M). At 1596, the circuitry may check whether the DLL reaches its phase-locked state or not. If not, a unit delay cell may be added, at 1598, to the full-rate delay line to increase one more delay to the feedback clock and, at 1592, the feedback clock (e.g. FCK/M) may be sent back to 1594 to further compare the edges of XCK/M to the edges of FCK/M at reduced-rate. At 1596, the circuitry may continuously check the DLL phase-locked status until the DLL reaches its phase-locked state. Once the DLL reaches its phase-locked state, at 1600, it may start to perform one or more of the following three operations: 1) To keep the DLL digital delay line constant and also signal the DLL has reached its phase-locked state; 2) To widen the digital lock-detect window, at 1594, and enable the analog mode operation of the mixed-mode DLL (not shown); 3) To enable the divide-by-N functions, at 1590 and 1592, for both the input clock (e.g. XCK/N) and feedback clock (e.g. FCK/N) to further reduce the clock rate of the DPD operation to gain the advantages of high-speed timing margin and low-power consumptions for this high performance and high efficiency adaptive DPD circuitry.

Additionally, the innovations herein may be achieved via implementations with differing or entirely different components, beyond the specific circuitry set forth above. With regard to such other components (e.g., circuitry, computing/processing components, etc.) and/or computer-readable media associated with or embodying the present inventions, for example, aspects of the innovations herein may be implemented consistent with numerous general purpose or special purpose computing systems or configurations. Various exemplary computing systems, environments, and/or configurations that may be suitable for use with the innovations herein may include, but are not limited to, various clock-related circuitry, such as that within personal computers, servers or server computing devices such as routing/connectivity components, hand-held or laptop devices, multiprocessor systems, microprocessor-based systems, set top boxes, smart phones, consumer electronic devices, network PCs, other existing computer platforms, distributed computing environments that include one or more of the above systems or devices, etc.

In some instances, aspects of the innovations herein may be achieved via logic and/or logic instructions including program modules, executed in association with the circuitry, for example. In general, program modules may include routines, programs, objects, components, data structures, etc. that perform particular tasks or implement particular control, delay or instructions. The inventions may also be practiced in the context of distributed circuit settings where circuitry is connected via communication buses, circuitry or links. In distributed settings, control/instructions may occur from both local and remote computer storage media including memory storage devices.

Innovative circuitry and components herein may also include and/or utilize one or more type of computer readable media. Computer readable media can be any available media that is resident on, associable with, or can be accessed by such circuits and/or computing components. By way of example, and not limitation, computer readable media may comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical storage, magnetic tape, magnetic disk storage or other magnetic storage devices, or any other medium which can be used to store the desired information and can accessed by computing component. Communication media may comprise computer readable instructions, data structures, program modules or other data embodying the functionality herein embodied in tangible form. Combinations of the any of the above are also included within the scope of computer readable media, though no form of transitory media is considered to be within the scope of the disclosure and claims herein.

In the present description, the terms component, module, device, etc. may refer to any type of logical or functional circuits, blocks and/or processes that may be implemented in a variety of ways. For example, the functions of various circuits and/or blocks can be combined with one another into any other number of modules. Each module may even be implemented as a software program stored on a tangible memory (e.g., random access memory, read only memory, CD-ROM memory, hard disk drive) to be read by a central processing unit to implement the functions of the innovations herein. Or, the modules can comprise programming instructions transmitted to a general purpose computer or to processing/graphics hardware via a transmission carrier wave. Also, the modules can be implemented as hardware logic circuitry implementing the functions encompassed by the innovations herein. Finally, the modules can be implemented using special purpose instructions (SIMD instructions), field programmable logic arrays or any mix thereof which provides the desired level performance and cost.

As disclosed herein, implementations and features consistent with the present inventions may be implemented through computer-hardware, software and/or firmware. For example, the systems and methods disclosed herein may be embodied in various forms including, for example, a data processor, such as a computer that also includes a database, digital electronic circuitry, firmware, software, or in combinations of them. Further, while some of the disclosed implementations describe components such as software, systems and methods consistent with the innovations herein may be implemented with any combination of hardware, software and/or firmware. Moreover, the above-noted features and other aspects and principles of the innovations herein may be implemented in various environments. Such environments and related applications may be specially constructed for performing the various processes and operations according to the invention or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with teachings of the invention, or it may be more convenient to construct a specialized apparatus or system to perform the required methods and techniques. Aspects of the method and system described herein, such as the logic, may be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various logic and/or functions disclosed herein may be enabled using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, and so on).

Unless the context clearly requires otherwise, throughout the description and elsewhere, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Although certain presently preferred implementations of the invention have been specifically described herein, it will be apparent to those skilled in the art to which the invention pertains that variations and modifications of the various implementations shown and described herein may be made without departing from the spirit and scope of the invention. Accordingly, it is intended that the invention be limited only to the extent required by the applicable rules of law.

We claim:

1. A method for detecting and adaptively locking phase of circuitry, the method comprising:
   detecting an input signal phase of a reference clock and an output signal phase of a feedback clock;
   reducing a rate of the input signal phase and a rate of the output signal phase by a first amount, M;
   comparing one or both of a rising edge and/or a falling edge of the reduced rate of the reference clock to a rising edge and/or a falling edge of the reduced rate of the feedback clock;
   adjusting, via a digital adjustment mode, the feedback clock until the output signal phase is approximately equal to the input signal phase;
   when the output signal phase is approximately equal to the input signal phase, entering an analog adjustment mode which includes reducing the rate of the input signal phase and the rate of the output signal phase by a second amount, N;
   adjusting the output signal until the output signal phase is equal to the input signal phase, whereupon the circuitry changes from an unlocked state to a locked state.

2. The method of claim 1 further comprising one or more of:
   comparing a leading or rising edge of the reduced rate reference clock to a leading or rising edge of the reduced rate feedback clock;
   comparing a trailing or falling edge of the reduced rate reference clock to a trailing or falling edge of the reduced rate feedback clock; and/or
   continuing the analog adjustment mode after the locked state is reached, including widening a phase detection window, which enables ability to hold the circuitry in the locked state when the circuitry is experiencing jitter or noise, thereby reducing spurious transition back to the unlocked state.

3. The method of claim 1, wherein the analog adjustment mode is continued after the locked state is reached and includes utilization of a widened phase detection window, which enables improved ability to hold at a lock state when experiencing jitter or noise thereby reducing spurious transition back to the unlocked state.

4. The method of claim 1, further comprising:
   performing digital adjustment of phase including digital phase delay until the feedback clock phase is within a first window of the reference clock phase;
   holding the digital phase delay; and
   performing analog adjustment of phase until the feedback clock phase is equal to the reference clock phase.

5. The method of claim 1, further comprising one or both of:
   widening a second detection window during the analog detection mode to facilitate maintaining a lock; and/or
   widening the second detection window via moving a rising or leading edge of the second detection window earlier.

6. The method of claim 1, further comprising moving a leading edge of a phase detection window earlier via bypassing a circuit in a path of the reference clock.

7. The method of claim 1, wherein widening a second detection window is achieved via moving a trailing edge of the second detection window later.

8. The method of claim 1, further comprising moving a falling or trailing edge of a phase detection window later via adding an extra delay circuit or circuitry in a path of the reference clock.

9. The method of claim 1, further comprising detecting the phase via a first phase detection window having a duration of between about 50 to about 900 picoseconds.

10. The method of claim 1, further comprising detecting the phase via a first phase detection window having a width established as a function of a frequency of the input signal, of a magnitude on scale with between about 100 to about 200 picoseconds for an input signal in a frequency range of about 100 MHz to about 2 GHz.

11. The method of claim 1, further comprising, in analog adjustment mode and during lock, widening a phase detect window within which the phase is detected to reduce unwanted transition back to the unlocked state caused by spurious effects on the circuitry, such as jitter or noise.

12. The method of claim 1, wherein a clock rate is reduced to provide a wider phase detect margin during the analog adjustment mode and the locked state to insulate from jitter or noise.

13. The method of claim 1, wherein a clock rate is reduced during the analog adjustment mode and the locked state to insulate from jitter or noise.

14. The method of claim 1, wherein a phase detection window of the digital adjustment mode is widened by one or both of:
   shifting a rising or leading edge of the phase detection window earlier; and/or
   shifting a falling or trailing edge of the phase detection window later.

15. The method of claim 1, wherein a first or leading edge of a phase detection window is shifted earlier via reducing or eliminating delay in a circuit path associated with the digital adjustment mode or the analog adjustment mode.

16. The method of claim 15, wherein the reducing or eliminating delay includes removing or bypassing a circuit that provides delay.

17. The method of claim 1, wherein a second or trailing edge of the detection window is shifted later via introduction of delay or multiplexing circuitry.

18. The method of claim 1, wherein delay associated with adjusting the output signal phase to match the input signal phase is introduced by adding an extra delay circuit via multiplexing the output signal.

19. The method of claim 1, wherein the rate of the output signal phase is decreased via introduction of divide-by-N circuitry, divide-by-3 circuitry, or divide-by-4 circuitry.

20. The method of claim 1 further comprising shifting a second or trailing edge of a detection window, in which the output signal phase is compared to the input signal phase, later via introducing delay during to digital adjustment mode.

21. The method of claim 1 wherein the analog adjustment mode, including utilization of a widened phase detection window, is continued after the locked state is reached to maintain the locked state.

22. The method of claim 1 further comprising reducing frequency of the output signal associated with the feedback clock and/or reducing frequency of the input signal associated with the reference clock.

23. The method of claim 1 further comprising feeding the reference clock through a frequency reduction component during the analog adjustment mode to widen a phase detect window.

24. The method of claim 23 wherein the frequency reduction component includes a divide-by-N circuit, a divide-by-3 circuit, or a divide-by-4 circuit.

25. The method of claim 1 further comprising providing, in a circuit path of the feedback clock, a divide-by-N circuit, a divide-by-3 circuit, or a divide-by-4 circuit, through which the feedback clock is fed during an adjustment mode to widen a phase detection window.

26. The method of claim 1 further comprising providing, in a circuit path of the reference clock, a divide-by-N circuit, a divide-by-3 circuit, or a divide-by-4 circuit, through which the reference clock is fed during an adjustment mode to widen a phase detection window.

\* \* \* \* \*